United States Patent
Nikopourdeilami et al.

(10) Patent No.: US 8,555,145 B2
(45) Date of Patent: Oct. 8, 2013

(54) SYSTEMS AND METHODS OF ENCODING USING A REDUCED CODEBOOK WITH ADAPTIVE RESETTING

(75) Inventors: Hosein Nikopourdeilami, Ottawa (CA); Jun Yuan, Kanata (CA); Mo-Han Fong, Ottawa (CA); Mohammadhadi Baligh, Kanata (CA)

(73) Assignee: Apple Inc., Cupertino, CA (US)

( * ) Notice: Subject to any disclaimer, the term of this patent is extended or adjusted under 35 U.S.C. 154(b) by 407 days.

(21) Appl. No.: 12/874,707

(22) Filed: Sep. 2, 2010

(65) Prior Publication Data

US 2011/0164701 A1 Jul. 7, 2011

Related U.S. Application Data

(63) Continuation-in-part of application No. 12/806,208, filed on Sep. 2, 2009, now abandoned.

(60) Provisional application No. 61/094,178, filed on Sep. 4, 2008.

(51) Int. Cl.
| | |
|---|---|
| *H03M 13/00* | (2006.01) |
| *H04Q 1/20* | (2006.01) |
| *H04L 27/28* | (2006.01) |
| *H04L 23/02* | (2006.01) |
| *H04L 1/02* | (2006.01) |
| *H04L 27/00* | (2006.01) |
| *H04B 17/00* | (2006.01) |
| *G06F 11/00* | (2006.01) |

(52) U.S. Cl.
USPC .......... 714/774; 714/755; 714/781; 375/224; 375/260; 375/262; 375/267; 375/295; 375/346; 455/226.1; 370/216; 370/241; 370/242

(58) Field of Classification Search
USPC ............... 714/774, 821, 755; 375/295, 224, 375/260, 262, 267, 299, 346, 347; 455/226.1; 370/216, 241, 242
See application file for complete search history.

(56) References Cited

U.S. PATENT DOCUMENTS 5,444,800 A * 8/1995 Kim ............................. 382/239
6,192,256 B1 * 2/2001 Whinnett ................... 455/562.1
(Continued)

FOREIGN PATENT DOCUMENTS

| WO | 2006117665 | 11/2006 |
| WO | 2008115036 | 9/2008 |
| WO | WO 2011088034 | * 7/2011 |

OTHER PUBLICATIONS

Love et al., Limited Feedback Precoding for Orthogonal Space-Time Block Codes, Nov. 2004, IEEE, pp. 561-565.*

(Continued)

*Primary Examiner* — John J Tabone, Jr.
(74) *Attorney, Agent, or Firm* — Meyertons, Hood, Kivlin, Kowert & Goetzel, P.C.

(57) ABSTRACT

To feedback MIMO channel conditions, a codeword from a codebook is selected. To reduce signalling, the codewords are organized into codeword subsets. The receiver signals an index of a codeword into a current codeword subset previously made known to the transmitter. The current codeword subset is adaptively selected based on a threshold criterion. For example, if the best codeword from the current codeword subset is not sufficiently similar to the best codeword in the full codebook, a switch in the codeword subset is made.

20 Claims, 18 Drawing Sheets

(56) References Cited

U.S. PATENT DOCUMENTS

| | | | |
|---|---|---|---|
| 6,747,580 B1* | 6/2004 | Schmidt | 341/50 |
| 6,859,503 B2* | 2/2005 | Pautler et al. | 375/299 |
| 7,949,064 B2* | 5/2011 | Lin et al. | 375/267 |
| 8,189,647 B2* | 5/2012 | Wu | 375/146 |
| 8,189,714 B2* | 5/2012 | Tong et al. | 375/299 |
| 2008/0037669 A1* | 2/2008 | Pan et al. | 375/260 |
| 2008/0227495 A1 | 9/2008 | Kotecha et al. | |
| 2008/0285667 A1 | 11/2008 | Mondal et al. | |
| 2009/0129502 A1* | 5/2009 | Tong et al. | 375/299 |
| 2009/0219895 A1* | 9/2009 | Wu | 370/335 |
| 2009/0245410 A1 | 10/2009 | Lee et al. | |
| 2011/0164701 A1 | 7/2011 | Nikopourdeilami et al. | |
| 2012/0066564 A1* | 3/2012 | Nikopourdeilami et al. | 714/755 |

OTHER PUBLICATIONS

IEEE 802.16m System Description Document, IEEE 802.16m-08/003r1, Apr. 30, 2008.

Rep. ITU-R M.2072 1, Report ITU-R M.2072, "World mobile telecommunication market forecast", (Question ITU-R 229/8).

Office Action and Notice of References Cited for related U.S. Appl. No. 12/806,208, Mar. 7, 2012, 11 pages.

International Search Report and Written Opinion dated Dec. 2, 2010 from corresponding PCT International Application No. PCT/CA2010/001368.

* cited by examiner

| Codebook C | |
|---|---|
| Codeword Index $i$ | Codeword $C_i$ |
| 0 | $C_0$ |
| 1 | $C_1$ |
| 2 | $C_2$ |
| 3 | $C_3$ |
| 4 | $C_4$ |
| ⋮ | ⋮ |
| 59 | $C_{59}$ |
| 60 | $C_{60}$ |
| 61 | $C_{61}$ |
| 62 | $C_{62}$ |
| 63 | $C_{63}$ |

$i = 0, 1, 2, \ldots M-1; M=64$

FIG. 15

| Codebook C | | |
|---|---|---|
| Codeword Index $i$ | Codeword $C_i$ | Codeword Subset $S_i$ |
| 0 | $C_0$ | $S_0$ |
| 1 | $C_1$ | $S_1$ |
| 2 | $C_2$ | $S_2$ |
| 3 | $C_3$ | $S_3$ |
| 4 | $C_4$ | $S_4$ |
| ⋮ | ⋮ | ⋮ |
| 59 | $C_{59}$ | $S_{59}$ |
| 60 | $C_{60}$ | $S_{60}$ |
| 61 | $C_{61}$ | $S_{61}$ |
| 62 | $C_{62}$ | $S_{62}$ |
| 63 | $C_{63}$ | $S_{63}$ |

$i = 0, 1, 2, \ldots M-1; M=64$

FIG. 17

| Codebook C | |
|---|---|
| Codeword Index | Codeword $C_j$ |
| 0 | $C_3$ |
| 1 | $C_{13}$ |
| 2 | $C_{16}$ |
| 3 | $C_{25}$ |
| 4 | $C_{37}$ |
| 5 | $C_{41}$ |
| 6 | $C_{49}$ |
| 7 | $C_{60}$ |

FIG. 18

SYSTEMS AND METHODS OF ENCODING USING A REDUCED CODEBOOK WITH ADAPTIVE RESETTING

CROSS-REFERENCE TO RELATED APPLICATIONS

This application is a continuation-in-part of the non-provisional application (12/806,208, now abandoned) resulting from conversion under 37 C.F.R. §1.53(c)(3) of U.S. provisional patent application no. 61/239,111 filed on Sep. 2, 2009, which claims the benefit of U.S. provisional patent application No. 61/094,178 filed on Sep. 4, 2008, which is hereby incorporated by reference in its entirety.

FIELD

This application relates to systems and methods of encoding using a reduced codebook with adaptive resetting, for example for use in wireless communication systems.

BACKGROUND

Draft IEEE 802.16m System Description Document, IEEE 802.16m-08/003r1, dated Apr. 15, 2008, it is stated that:

This [802.16m] standard amends the IEEE 802.16 WirelessMAN-OFDMA specification to provide an advanced air interface for operation in licensed bands. It meets the cellular layer requirements of IMT-Advanced next generation mobile networks. This amendment provides continuing support for legacy WirelessMAN-QFDMA equipment.

And the standard will address the following purpose:

i. The purpose of this standard is to provide performance improvements necessary to support future advanced services and applications, such as those described by the ITU in Report ITU-R M.2072.

Providing feedback in a multiple-input multiple-output (MIMO) communication environment has proven to significantly benefit performance. In early systems that employed feedback, weighting factors were created at the MIMO receiver based on channel conditions. A codeword was fed back from the MIMO receiver to the transmitter, which would apply the weighting factors to the respective signals to be transmitted from the different MIMO transmitter antennas. The weighting factors effectively pre-distorted the signals to be transmitted to reverse the effects of the communication channel. Accordingly, the signals received at the MIMO receiver's antennas approximated those that would have been received without weighting through a clear channel. Unfortunately, channel conditions frequently if not continuously change, and the weighting factors to represent channel conditions are data-intensive. In light of the limited bandwidth available for feedback, providing weighting factors for changing channel conditions became unfeasible.

In an effort to reduce the bandwidth required to provide feedback for a MIMO channel, designers developed codebooks, which are maintained at the MIMO transmitter and MIMO receiver. The codebooks include codewords, which are pointers to predefined weighting factors (which could include amplitude and phase information). These predefined weighting factors are configured to cover the range of possible channel conditions through a fixed number of discrete weighting factors. Each of the codewords in a codebook is associated with a codeword index. In operation, the MIMO receiver will systematically determine the channel conditions and select the most appropriate codeword in light of the channel conditions. Instead of sending the codeword, which includes the weighting factors, the MIMO receiver will send the codeword index to the MIMO transmitter over an appropriate feedback channel. The MIMO transmitter will receive the codeword index, obtain the weighting factors of the corresponding codeword, and apply those weighting factors to the signals to be transmitted from the different transmit antennas.

The number of codewords in the codebook impacts the bandwidth required for feedback and the performance enhancement associated with using feedback. Unfortunately, as the number of codewords increases, the bandwidth required to feed back the codeword index to the MIMO transmitter from the MIMO receiver increases. Incorporating the use of codebooks and providing the codeword index instead of the entire weighting factors as feedback has provided performance enhancement over systems providing the entire weighting factors as feedback.

FIGS. 7-13 of the present application correspond to FIGS. 1-7 of IEEE 802.16m-08/003r1.

SUMMARY

Aspects and features of the present application will become apparent to those ordinarily skilled in the art upon review of the following description of specific embodiments of a disclosure in conjunction with the accompanying drawing figures and appendices.

According to one aspect of the present invention, there is provided a method comprising: in respect of a plurality of codewords of a full codebook and a plurality of codeword subsets, each codeword subset containing a respective plurality of the codewords of the full codebook, repeatedly: determining a best codeword from the full codebook; adaptively selecting a codeword subset of the plurality of codeword subsets to be a current codeword subset by selecting, based on a threshold criterion, between a) the most recently selected current codeword subset and b) another codeword subset that contains the best codeword from the full codebook; if adaptively selecting results in a change in the current codeword subset, transmitting an indication of the current codeword subset; transmitting an index of a codeword within the current codeword subset of the plurality of codeword subsets.

According to another aspect of the present invention, there is provided an apparatus comprising: receive circuitry associated with a plurality of antennas; transmit circuitry associated with the plurality antennas; and a memory containing codeword subsets; a subset selector based on threshold criterion that causes the apparatus to perform a method comprising: in respect of a plurality of codewords of a full codebook and a plurality of codeword subsets, each codeword subset containing a respective plurality of the codewords of the full codebook, repeatedly: determining a best codeword from the full codebook; adaptively selecting a codeword subset of the plurality of codeword subsets to be a current codeword subset by selecting, based on a threshold criterion, between a) the most recently selected current codeword subset and b) another codeword subset that contains the best codeword from the full codebook; if adaptively selecting results in a change in the current codeword subset, transmitting an indication of the current codeword subset; transmitting an index of a codeword within the current codeword subset of the plurality of codeword subsets.

BRIEF DESCRIPTION OF THE DRAWINGS

Embodiments of the present application will now be described, by way of example only, with reference to the accompanying drawing figures wherein:

FIG. 15 is a table showing a set of codewords and corresponding codeword indices;

FIG. 17 is a table showing a codeword subset;

FIG. 18 is a flowchart of a method of transmitting codeword indices;

DETAILED DESCRIPTION

Figure 1:
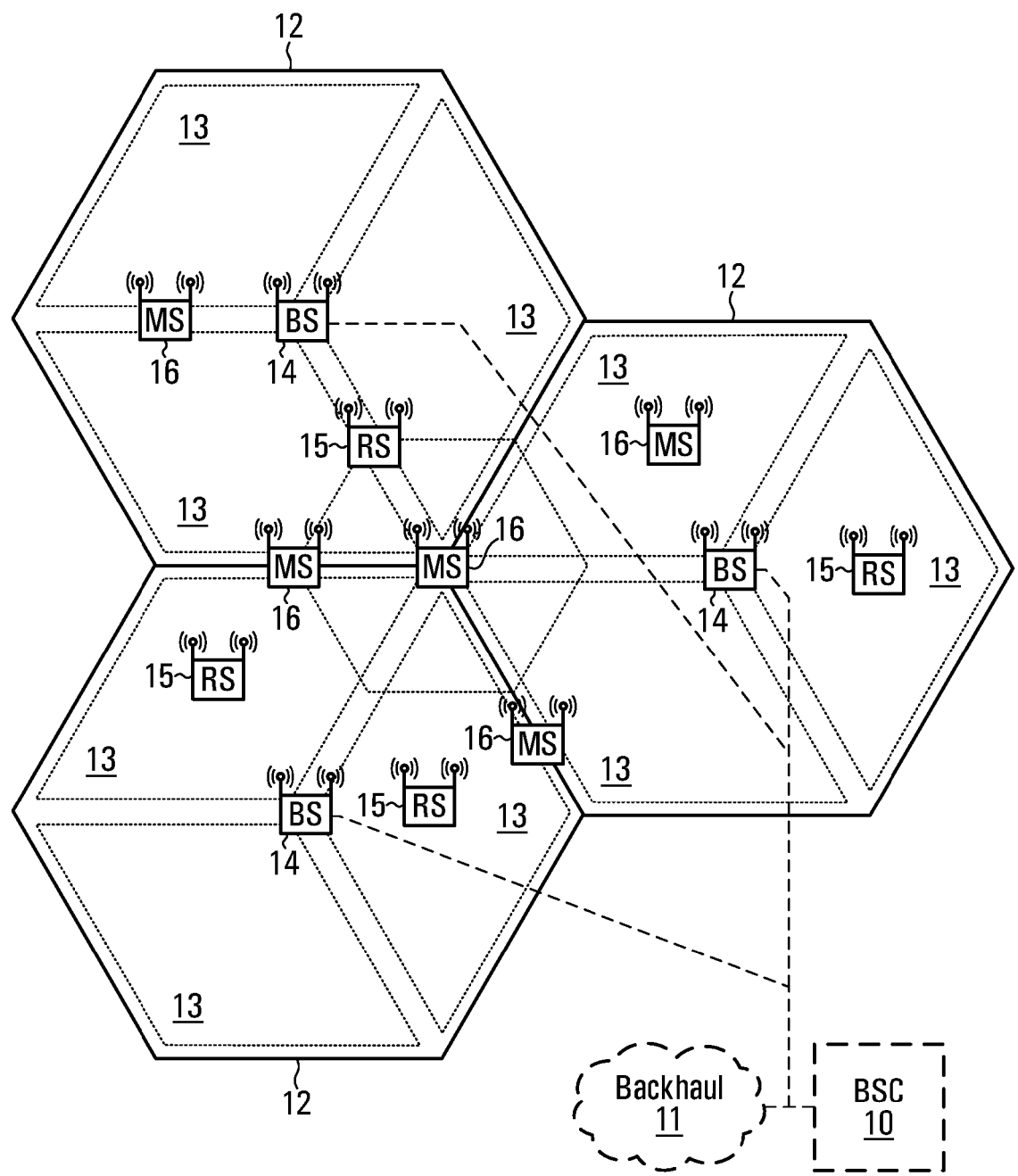
FIG. 1 is a block diagram of a cellular communication system.

Referring to the drawings, FIG. 1 shows a base station controller (BSC) 10 which controls wireless communications within multiple cells 12, which cells are served by corresponding base stations (BS) 14. In some configurations, each cell is further divided into multiple sectors 13 or zones (not shown). In general, each base station 14 facilitates communications using OFDM with mobile and/or wireless terminals 16, which are within the cell 12 associated with the corresponding base station 14. The movement of the mobile terminals 16 in relation to the base stations 14 results in significant fluctuation in channel conditions. As illustrated, the base stations 14 and mobile terminals 16 may include multiple antennas to provide spatial diversity for communications. In some configurations, relay stations 15 may assist in communications between base stations 14 and wireless terminals 16. Wireless terminals 16 can be handed off from any cell 12, sector 13, zone (not shown), base station 14 or relay 15 to an other cell 12, sector I 3, zone (not shown), base station 14 or relay 15. In some configurations, base stations 14 communicate with each and with another network (such as a core network or the internet, both not shown) over a backhaul network 11. In some configurations, a base station controller 10 is not needed.

Figure 2:
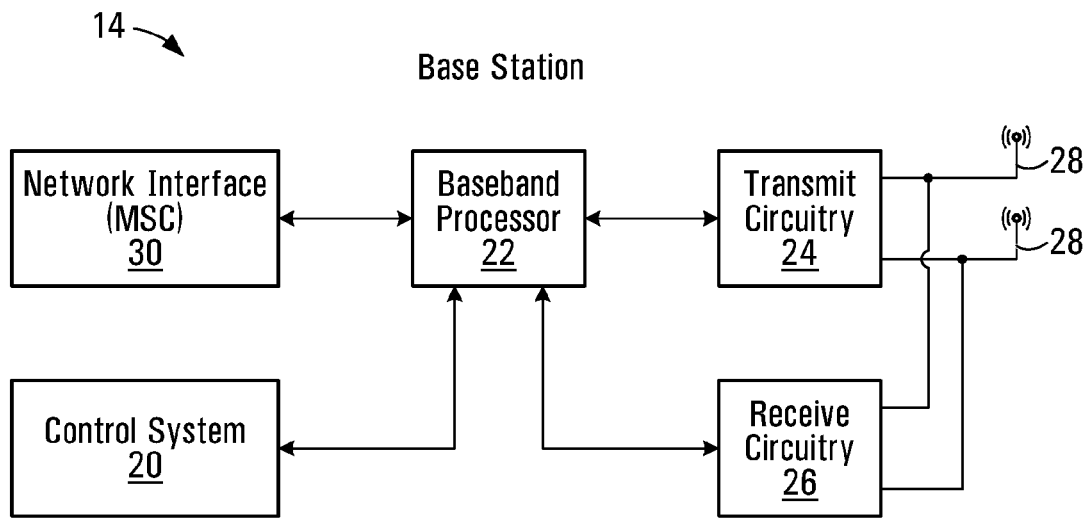
FIG. 2 is a block diagram of an example base station that might be used to implement some embodiments of the present application.

With reference to FIG. 2, an example of a base station 14 is illustrated. The base station 14 generally includes a control system 20, a baseband processor 22, transmit circuitry 24, receive circuitry 26, multiple antennas 28, and a network interface 30. The receive circuitry 26 receives radio frequency signals bearing information from one or more remote transmitters provided by mobile terminals 16 (illustrated in FIG. 3) and relay stations 15 (illustrated in FIG. 4). A low noise amplifier and a filter (not shown) may cooperate to amplify and remove broadband interference from the signal for processing. Down conversion and digitization circuitry (not shown) will then down convert the filtered, received signal to an intermediate or baseband frequency signal, which is then digitized into one or more digital streams.

The baseband processor 22 processes the digitized received signal to extract the information or data bits conveyed in the received signal. This processing typically comprises demodulation, decoding, and error correction operations. As such, the baseband processor 22 is generally implemented in one or more digital signal processors (DSPs) or application-specific integrated circuits (ASICs). The received information is then sent across a wireless network via the network interface 30 or transmitted to another mobile terminal 16 serviced by the base station 14, either directly or with the assistance of a relay 15.

On the transmit side, the baseband processor 22 receives digitized data, which may 20 represent voice, data, or control information, from the network interface 30 under the control of control system 20, and encodes the data for transmission. The encoded data is output to the transmit circuitry 24, where it is modulated by one or more carrier signals having a desired transmit frequency or frequencies. A power amplifier (not shown) will amplify the modulated carrier signals to a level appropriate for transmission, and deliver the modulated carrier signals to the antennas 28 through a matching network (not shown). Modulation and processing details are described in greater detail below.

Figure 3:
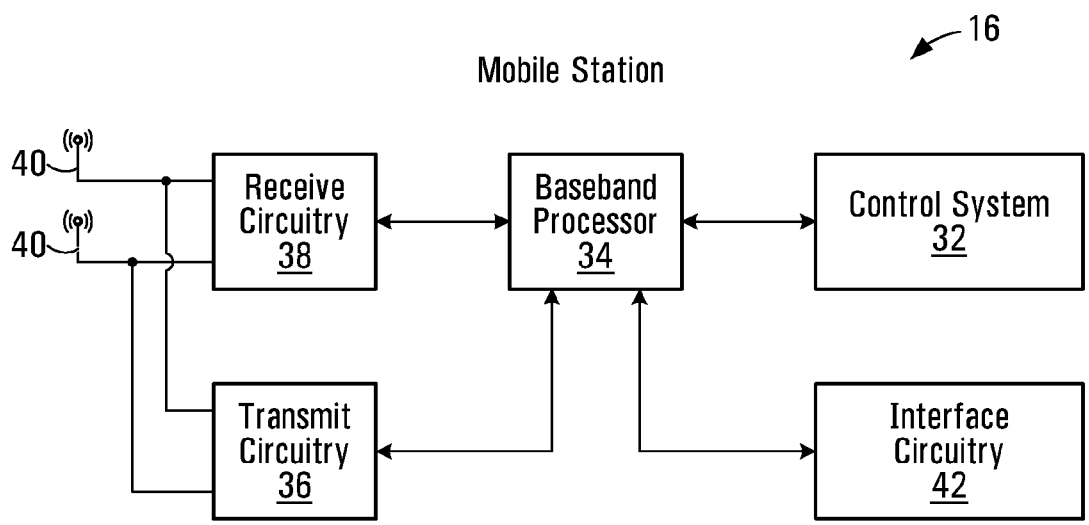
FIG. 3 is a block diagram of an example wireless terminal that might be used to implement some embodiments of the present application.

With reference to FIG. 3, an example of a mobile terminal 16 is illustrated. Similarly to the base station 14, the mobile terminal 16 will include a control system 32, a baseband processor 34, transmit circuitry 36, receive circuitry 38, multiple antennas 40, and user interface circuitry 42. The receive circuitry 38 receives radio frequency signals bearing information from one or more base stations 14 and relays 15. A low noise amplifier and a filter (not shown) may cooperate to amplify and remove broadband interference from the signal for processing. Down conversion and digitization circuitry (not shown) will then down convert the filtered, received signal to an intermediate or baseband frequency signal, which is then digitized into one or more digital streams.

The baseband processor 34 processes the digitized received signal to extract the information or data bits conveyed in the received signal. This processing typically comprises demodulation, decoding, and error correction operations. The baseband processor 34 is generally implemented in one or more digital signal processors (DSPs) and application specific integrated circuits (ASICs).

For transmission, the baseband processor 34 receives digitized data, which may represent voice, video, data, or control information, from the control system 32, which it encodes for transmission. The encoded data is output to the transmit circuitry 36, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 40 through a matching network (not shown). Various modulation and processing techniques available to those skilled in the art are used for signal transmission between the mobile terminal and the base station, either directly or via the relay station.

In OFDM modulation, the transmission band is divided into multiple, orthogonal carrier waves. Each carrier wave is modulated according to the digital data to be transmitted. Because OFDM divides the transmission band into multiple carriers, the bandwidth per carrier decreases and the modulation time per carrier increases. Since the multiple carriers are transmitted in parallel, the transmission rate for the digital data, or symbols, on any given carrier is lower than when a single carrier is used.

OFDM modulation utilizes the performance of an Inverse Fast Fourier Transform (IFFT) on the information to be transmitted. For demodulation, the performance of a Fast Fourier Transform (FFT) on the received signal recovers the transmitted information. In practice, the IFFT and FFT are provided by digital signal processing carrying out an Inverse Discrete Fourier Transform (IFFT) and Discrete Fourier Transform (DFT), respectively. Accordingly, the characterizing feature of OFDM modulation is that orthogonal carrier waves are generated for multiple bands within a transmission channel. The modulated signals are digital signals having a relatively low transmission rate and capable of staying within their respective bands. The individual carrier waves are not modulated directly by the digital signals. Instead, all carrier waves are modulated at once by IFFT processing.

In operation, OFDM is preferably used for at least downlink transmission from the base stations 14 to the mobile terminals 16. Each base station 14 is equipped with "n" transmit antennas 28 (n>=I), and each mobile terminal 16 is equipped with "in" receive antennas 40 (m>=1). Notably, the respective antennas can be used for reception and transmission using appropriate duplexers or switches and are so labeled only for clarity.

When relay stations 15 are used, OFDM is preferably used for downlink transmission from the base stations 14 to the relays 15 and from relay stations 15 to the mobile terminals 16.

Figure 4:
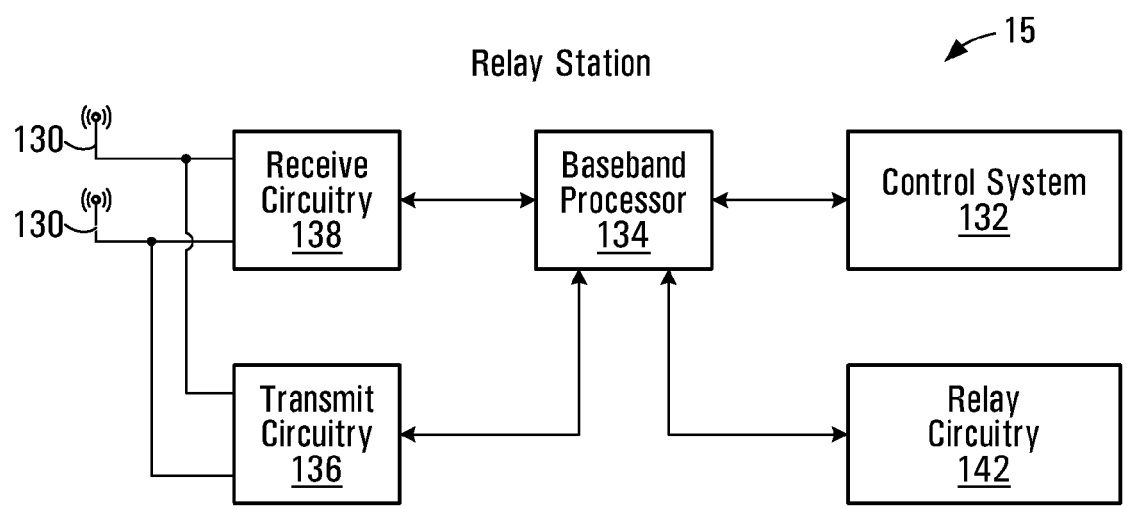
FIG. 4 is a block diagram of an example relay station that might be used to implement some embodiments of the present application.

With reference to FIG. 4, an example of a relay station 15 is illustrated. Similarly to the base station 14, and the mobile terminal 16, the relay station 15 will include a control system 132, a baseband processor 134, transmit circuitry 136, receive circuitry 138, multiple antennas 130, and relay circuitry 142. The relay circuitry 142 enables the relay 14 to assist in communications between a base station 15 and mobile terminals 16. The receive circuitry 138 receives radio frequency signals bearing information from one or more base stations 14 and mobile terminals 16. A low noise amplifier and a filter (not shown) may cooperate to amplify and remove broadband interference from the signal for processing. Downconversion and digitization circuitry (not shown) will then downconvert the filtered, received signal to an intermediate or baseband frequency signal, which is then digitized into one or more digital streams.

The baseband processor 134 processes the digitized received signal to extract the information or data bits conveyed in the received signal. This processing typically comprises demodulation, decoding, and error correction operations. The baseband processor 134 is generally implemented in one or more digital signal processors (DSPs) and application specific integrated circuits (ASICs).

For transmission, the baseband processor 134 receives digitized data, which may represent voice, video, data, or control information, from the control system 132, which it encodes for transmission. The encoded data is output to the transmit circuitry 136, where it is used by a modulator to modulate one or more carrier signals that is at a desired transmit frequency or frequencies. A power amplifier (not shown) will amplify the modulated carrier signals to a level appropriate for transmission, and deliver the modulated carrier signal to the antennas 130 through a matching network (not shown). Various modulation and processing techniques available to those skilled in the art are used for signal transmission between the mobile terminal and the base station, either directly or indirectly via a relay station, as described above.

Figure 5:
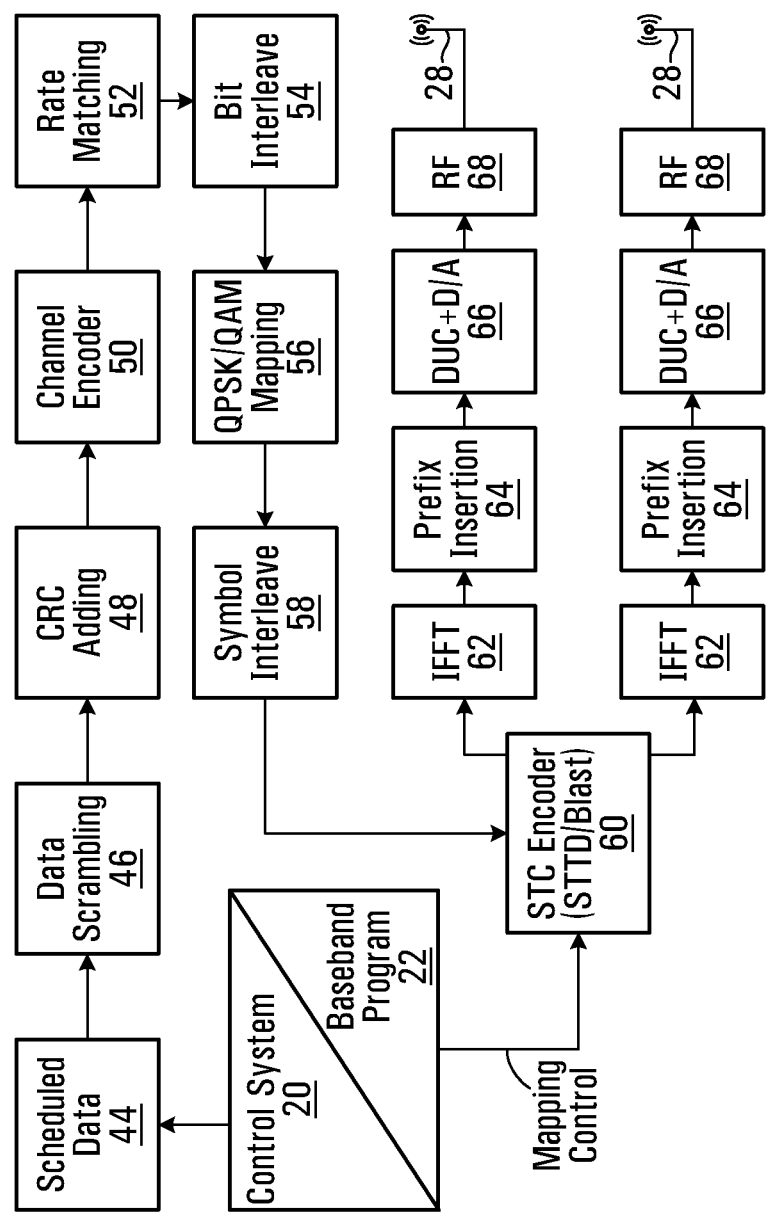
FIG. 5 is a block diagram of a logical breakdown of an example OFDM transmitter architecture that might be used to implement some embodiments of the present application.

With reference to FIG. 5, a logical OFDM transmission architecture will be described. Initially, the base station controller 10 will send data to be transmitted to various mobile terminals 16 to the base station 14, either directly or with the assistance of a relay station 15. The base station 14 may use the channel quality indicators (CQIs) associated with the mobile terminals to schedule the data for transmission as well as select appropriate coding and modulation for transmitting the scheduled data. The CQIs may be directly from the mobile terminals 16 or determined at the base station 14 based on information provided by the mobile terminals 16. In either case, the CQI for each mobile terminal 16 is a function of the degree to which the channel amplitude (or response) varies across the OFDM frequency band.

Scheduled data 44, which is a stream of bits, is scrambled in a manner reducing the peak-to-average power ratio associated with the data using data scrambling logic 46. A cyclic redundancy check (CRC) for the scrambled data is determined and appended to the scrambled data using CRC adding logic 48. Next, channel coding is performed using channel encoder logic 50 to effectively add redundancy to the data to facilitate recovery and error correction at the mobile terminal 16. Again, the channel coding for a particular mobile terminal 16 is based on the CQI. In some implementations, the channel encoder logic 50 uses known Turbo encoding techniques. The encoded data is then processed by rate matching logic 52 to compensate for the data expansion associated with encoding.

Bit interleaver logic 54 systematically reorders the bits in the encoded data to minimize the loss of consecutive data bits. The resultant data bits are systematically mapped into corresponding symbols depending on the chosen baseband modulation by mapping logic 56. Preferably, Quadrature Amplitude Modulation (QAM) or Quadrature Phase Shift Key (QPSK) modulation is used. The degree of modulation is preferably chosen based on the CQI for the particular mobile terminal. The symbols may be systematically reordered to further bolster the immunity of the transmitted signal to periodic data loss caused by frequency selective fading using symbol interleaver logic 58.

At this point, groups of bits have been mapped into symbols representing locations in an amplitude and phase constellation. When spatial diversity is desired, blocks of symbols are then processed by space-time block code (STC) encoder logic 60, which modifies the symbols in a fashion making the transmitted signals more resistant to interference and more readily decoded at a mobile terminal 16. The STC encoder logic 60 will process the incoming symbols and provide "n" outputs corresponding to the number of transmit antennas 28 for the base station 14. The control system 20 and/or baseband processor 22 as described above with respect to FIG. 5 will provide a mapping control signal to control STC encoding. At this point, assume the symbols for the "n" outputs are representative of the data to be transmitted and capable of being recovered by the mobile terminal 16.

For the present example, assume the base station 14 has two antennas 28 (n=2) and the STC encoder logic 60 provides two output streams of symbols. Accordingly, each of the symbol streams output by the STC encoder logic 60 is sent to a corresponding IFFT processor 62, illustrated separately for ease of understanding. Those skilled in the art will recognize that one or more processors may be used to provide such digital signal processing, alone or in combination with other processing described herein. The IFFT processors 62 will preferably operate on the respective symbols to provide an inverse Fourier Transform. The output of the IFFT processors 62 provides symbols in the time domain. The time domain symbols are grouped into frames, which are associated with a prefix by prefix insertion logic 64. Each of the resultant signals is up-converted in the digital domain to an intermediate frequency and converted to an analog signal via the corresponding digital up-conversion (DUC) and digital-to-analog (D/A) conversion circuitry 66. The resultant (analog) signals are then simultaneously modulated at the desired RF frequency, amplified, and transmitted via the RF circuitry 68 and antennas 28. Notably, pilot signals known by the intended mobile terminal 16 are scattered among the sub-carriers. The mobile terminal 16, which is discussed in detail below, will use the pilot signals for channel estimation.

Figure 6:
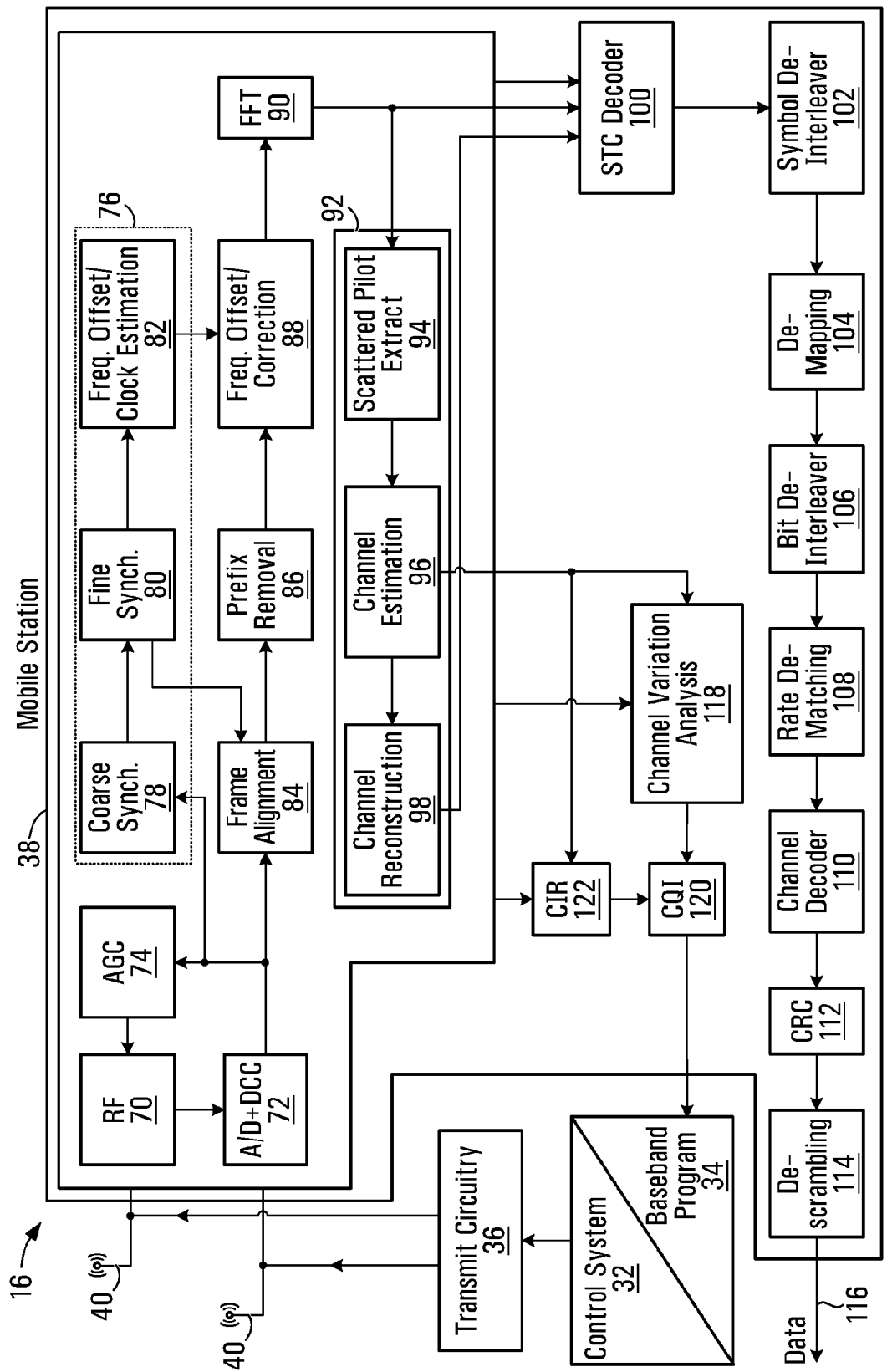
FIG. 6 is a block diagram of a logical breakdown of an example OFDM receiver architecture that might be used to implement some embodiments of the present application.
Figure 7:
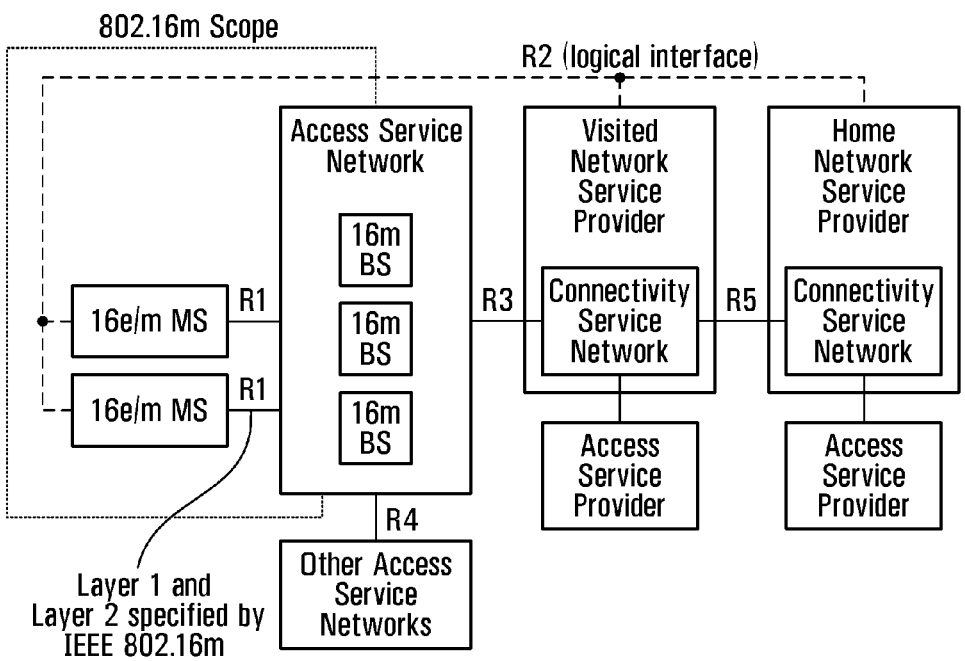
FIG. 7 is FIG. 1 of IEEE 802.16m-08/003r1, an Example of overall network architecture.
Figure 8:
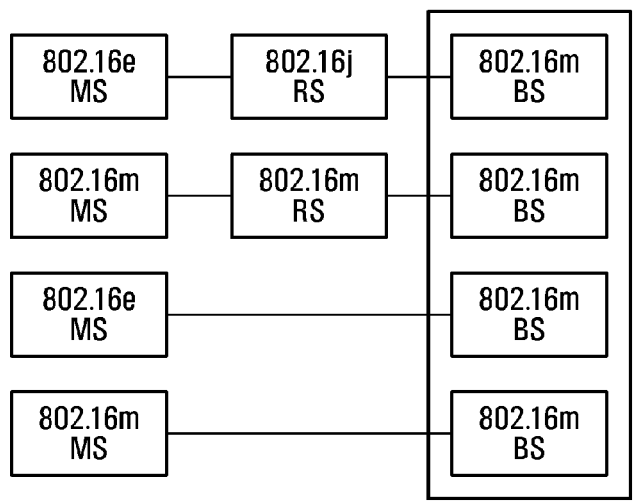
FIG. 8 is FIG. 2 of IEEE 802.16m-081003r1, a Relay Station in overall network architecture.
Figure 9:
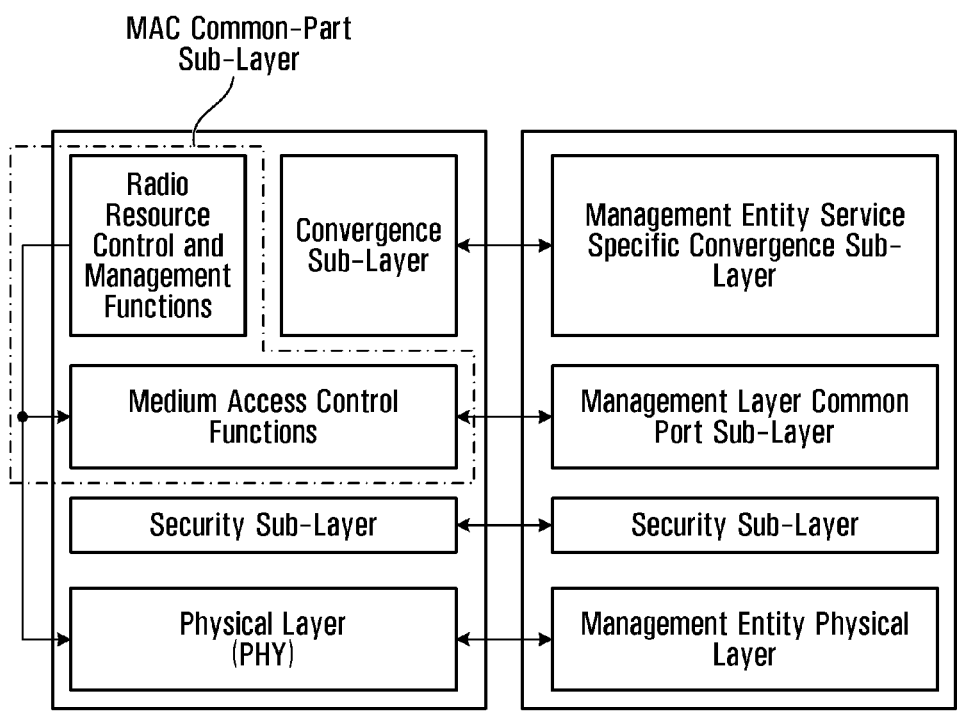
FIG. 9 is FIG. 3 of IEEE 802.16m-08/003r1, a System Reference
Model.
Figure 10:
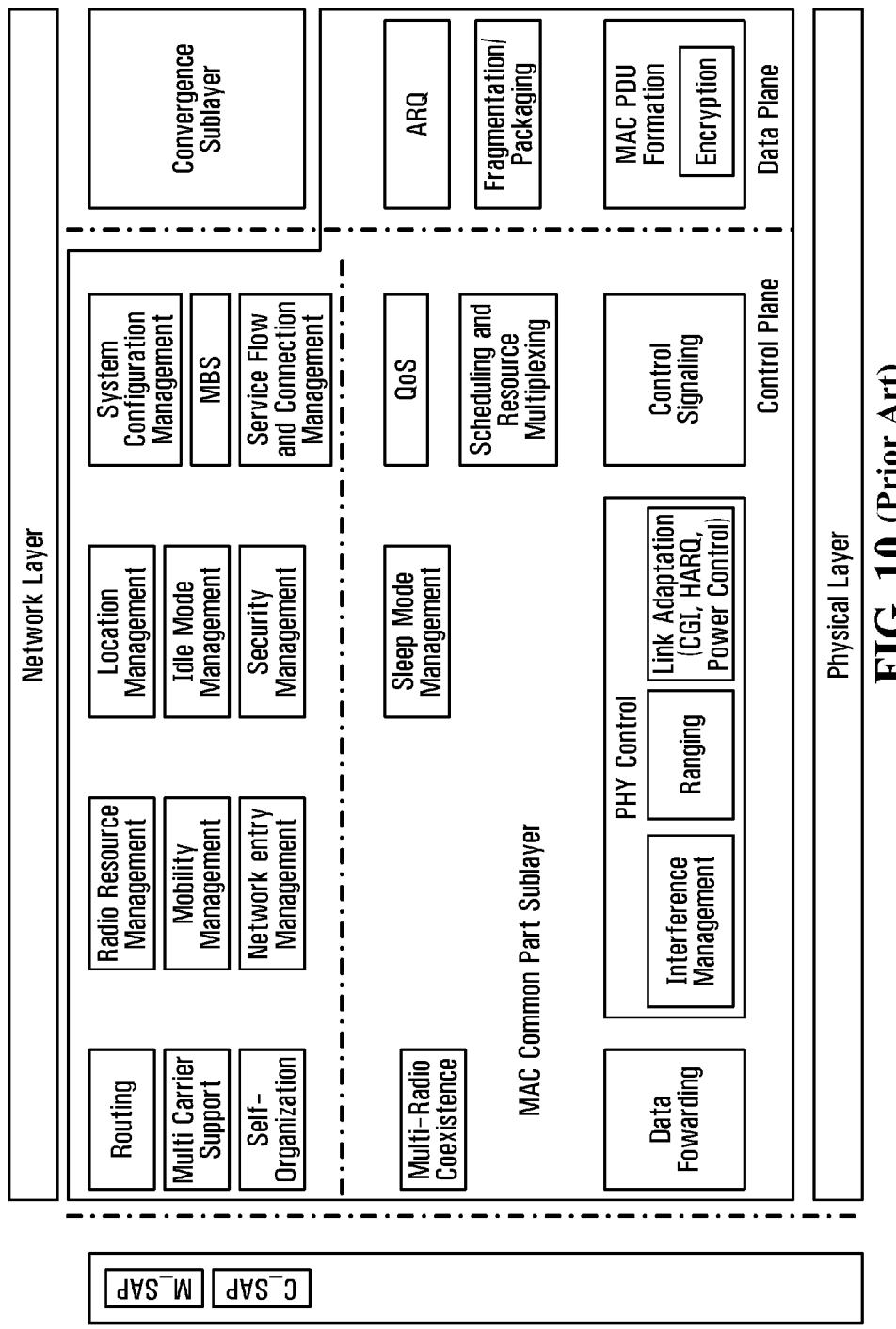
FIG. 10 is FIG. 4 of IEEE 802.16m-08/003r1, The IEEE 802.16m Protocol Structure.
Figure 11:
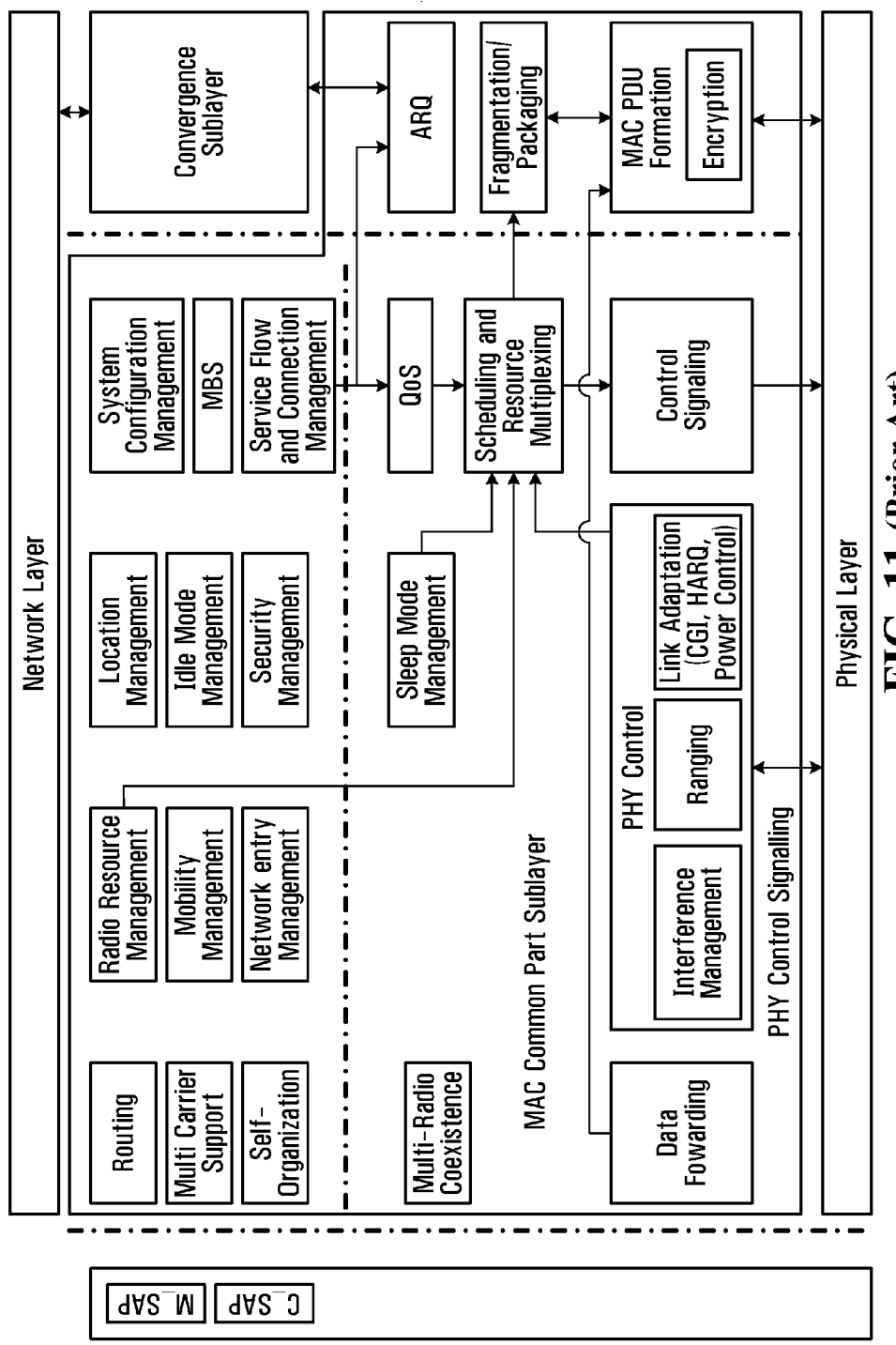
FIG. 11 is FIG. 5 of IEEE 802.16m-08/003r1, The IEEE 802.16m MS/ES Data Plane Processing flow.
Figure 12:
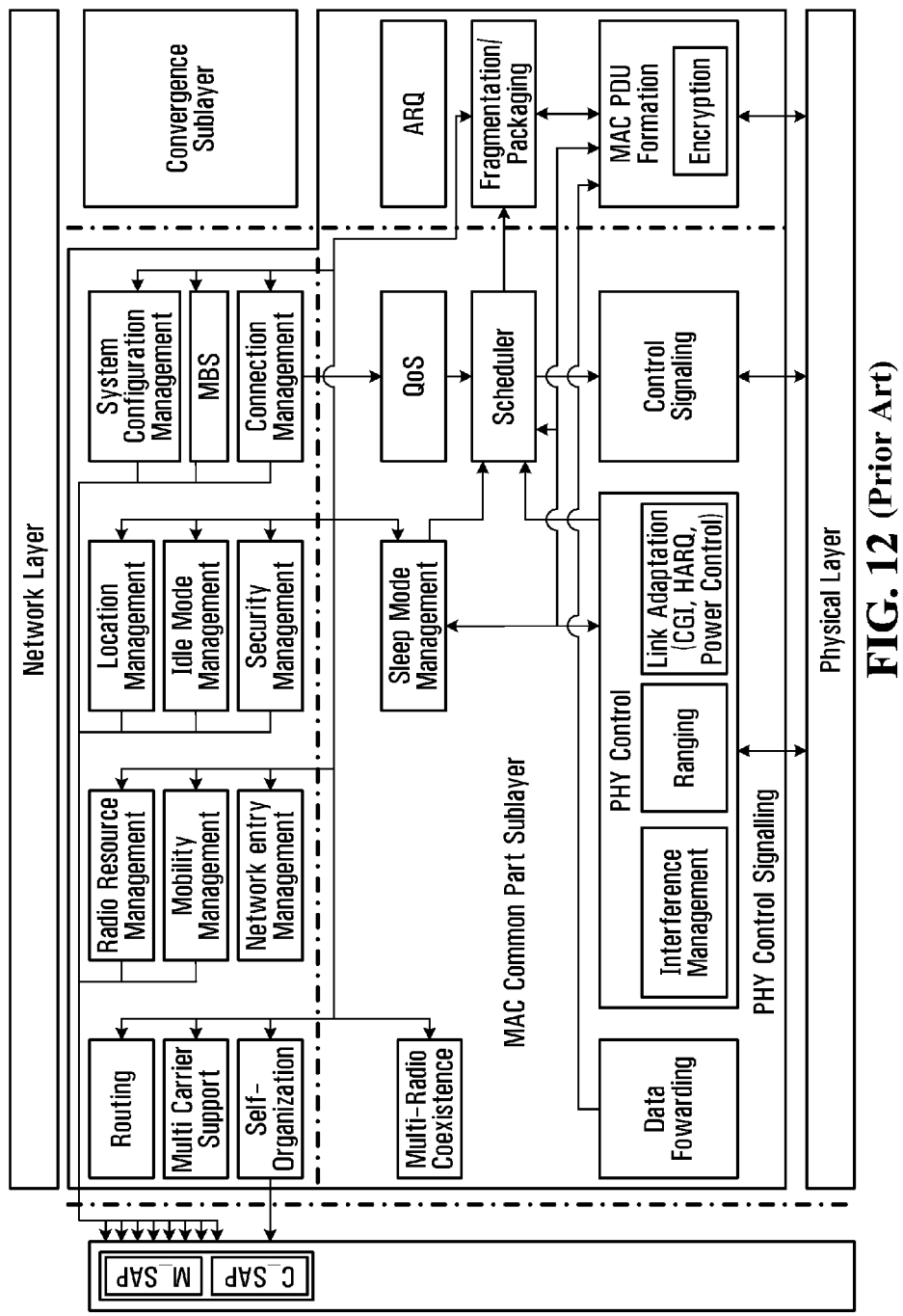
FIG. 12 is FIG. 6 of IEEE 802.16m-08/003r1, The IEEE 802.16m MS/BS Control Plane Processing Flow.
Figure 13:
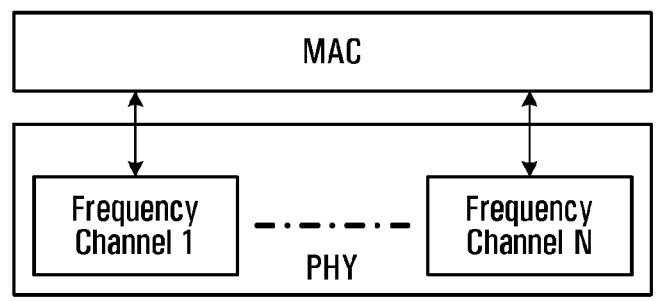
FIG. 13 is FIG. 7 of IEEE 802.16m-08/003r1, Generic protocol architecture to support multicarrier system.

Reference is now made to FIG. 6 to illustrate reception of the transmitted signals by a mobile terminal 16, either directly from base station 14 or with the assistance of relay 15. Upon arrival of the transmitted signals at each of the antennas 40 of the mobile terminal 16, the respective signals are demodulated and amplified by corresponding RF circuitry 70. For the sake of conciseness and clarity, only one of the two receive paths is described and illustrated in detail. Analog-to-digital converter (ADC) and down-conversion circuitry 72 digitizes and downconverts the analog signal for digital processing. The resultant digitized signal may be used by automatic gain control circuitry (AGC) 74 to control the gain of the amplifiers in the RF circuitry 70 based on the received signal level.

Initially, the digitized signal is provided to synchronization logic 76, which includes coarse synchronization logic 78, which buffers several OFDM symbols and calculates an autocorrelation between the two successive OFDM symbols. A resultant time index corresponding to the maximum of the correlation result determines a fine synchronization search window, which is used by fine synchronization logic 80 to determine a precise framing starting position based on the headers. The output of the fine synchronization logic 80 facilitates frame acquisition by frame alignment logic 84. Proper framing alignment is important so that subsequent FFT processing provides an accurate conversion from the time domain to the frequency domain. The fine synchronization algorithm is based on the correlation between the received pilot signals carried by the headers and a local copy of the known pilot data. Once frame alignment acquisition occurs, the prefix of the OFDM symbol is removed with prefix removal logic 86 and resultant samples are sent to frequency offset correction logic 88, which compensates for the system frequency offset caused by the unmatched local oscillators in the transmitter and the receiver. Preferably, the synchronization logic 76 includes frequency offset and clock estimation logic 82, which is based on the headers to help estimate such effects on the transmitted signal and provide those estimations to the correction logic 88 to properly process OFDM symbols.

At this point, the OFDM symbols in the time domain are ready for conversion to the frequency domain using FFT processing logic 90. The results are frequency domain symbols, which are sent to processing logic 92. The processing logic 92 extracts the scattered pilot signal using scattered pilot extraction logic 94. determines a channel estimate based on the extracted pilot signal using channel estimation logic 96, and provides channel responses for all sub-carriers using channel reconstruction logic 98. In order to determine a channel response for each of the sub-carriers, the pilot signal is essentially multiple pilot symbols that are scattered among the data symbols throughout the OFDM sub-carriers in a known pattern in both time and frequency. Continuing with FIG. 6, the processing logic compares the received pilot symbols with the pilot symbols that are expected in certain sub-carriers at certain times to determine a channel response for the sub-carriers in which pilot symbols were transmitted. The results are interpolated to estimate a channel response for most, if not all, of the remaining sub-carriers for which pilot symbols were not provided. The actual and interpolated channel responses are used to estimate an overall channel response, which includes the channel responses for most, if not all, of the sub-carriers in the OFDM channel.

The frequency domain symbols and channel reconstruction information, which are derived from the channel responses for each receive path are provided to an STC decoder 100, which provides STC decoding on both received paths to recover the transmitted symbols. The channel reconstruction information provides equalization information to the STC decoder 100 sufficient to remove the effects of the transmission channel when processing the respective frequency domain symbols.

The recovered symbols are placed back in order using symbol de-interleaver logic 102, which corresponds to the symbol interleaver logic 58 of the transmitter. The de-interleaved symbols are then demodulated or de-mapped to a corresponding bitstream using de-mapping logic 104. The bits are then de-interleaved using bit de-interleaver logic 106, which corresponds to the bit interleaver logic 54 of the transmitter architecture. The de-interleaved bits are then processed by rate de-matching logic 108 and presented to channel decoder logic 110 to recover the initially scrambled data and the CRC checksum. Accordingly. CRC logic 112 removes the CRC checksum, checks the scrambled data in traditional fashion, and provides it to the de-scrambling logic 114 for descrambling using the known base station de-scrambling code to recover the originally transmitted data 116.

In parallel to recovering the data 116, a CQI or at least information sufficient to create a CQI at the base station 14, is determined and transmitted to the base station 14. As noted above, the CQI may be a function of the carrier-to-interference ratio (CR). as well as the degree to which the channel response varies across the various sub-carriers in the OFDM frequency band. For this embodiment, the channel gain for each sub-carrier in the OFDM frequency band being used to transmit information is compared relative to one another to determine the degree to which the channel gain varies across the OFDM frequency band. Although numerous techniques are available to measure the degree of variation, one technique is to calculate the standard deviation of the channel gain for each sub-carrier throughout the OFDM frequency band being used to transmit data. In some embodiments, a relay station may operate in a time division manner using only one radio, or alternatively include multiple radios.

FIGS. 1 to 6 provide one specific example of a communication system that could be used to implement embodiments of the application. It is to be understood that embodiments of the application can be implemented with communications systems having architectures that are different than the specific example, but that operate in a manner consistent with the implementation of the embodiments as described herein.

FIGS. 7-13 of the present application correspond to FIGS. 1-7 of IEEE 802.16m-08/003r1.

The description of these figures in IEEE 802.16m-08/003r1 is incorporated herein by reference.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 14:
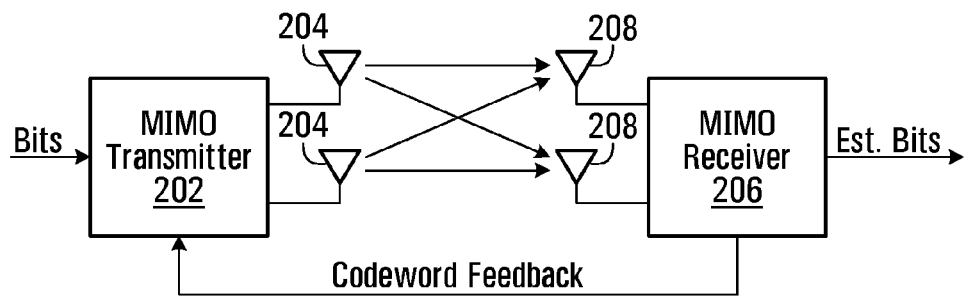
FIG. 14 is a block diagram of a MIMO system.

Embodiments of the present invention may in some cases, be used to improve performance of multiple-input multiple-output (MIMO) communication systems. As shown in FIG. 14, a MIMO transmitter 202 has multiple transmit antennas 204 from which MIMO signals are transmitted over a MIMO communication channel to a MIMO receiver 206. The MIMO signals may be space-time coded (STC) signals, which are defined to be any spatially diverse signals or spatially multiplexed signals. As such, the signals transmitted from different transmit antennas 204 may be the same or different signals. The MIMO signals are received at the MIMO receiver by multiple receive antennas 208.

In closed loop MIMO (CL-MIMO), the channel matrix is determined at the receiver such as a mobile station, and this is quantized to a codeword within a predefined codebook, and a codeword index is fed back to the transmitter such as a base station. Such a codebook C, such as that illustrated in FIG. 15, is provided in the MIMO transmitter 202 as well as the MIMO receiver 206. The codebook C will include M codewords $c_i$, where i is a unique codeword index for each codeword $c_i$. An index is simply any identifier of the codeword. Rather than transmitting a codeword of interest per se, the index of the codeword of interest can be transmitted, and assuming both ends of the communication are aware of the mapping between codewords and indexes, the codeword of interest can be recovered.

An approach is provided that can be used to reduce the amount of signaling required to convey codeword indices from the receiver to the transmitter. The approach is based on the expectation that more often than not, each time the channel matrix is determined and a new codeword from the defined codeword selected, the channel matrix, and the associated codeword will be relatively close to the previous channel matrix and associated codeword. However, it is to be clearly understood that the approaches described herein can be used to convey other types of information.

In the detailed examples that follow, it is assumed that the indices are simply integers, and that binary representations of the indices are transmitted, but other forms for the indices can be employed. In this example, there are 64 codewords $c_i$ (M=64), and the codeword indices are simply integers i that range from zero to M-1.

In some embodiments, each codeword defines weighting factors to apply to the MIMO signals, and may correspond to channel matrices or vectors to apply to the MIMO signals prior to transmission from the respective antennas 204 of the MIMO transmitter 202. In some embodiments, each codeword defined pre-coding to be applied in the MIMO transmitter 202.

Figure 16:
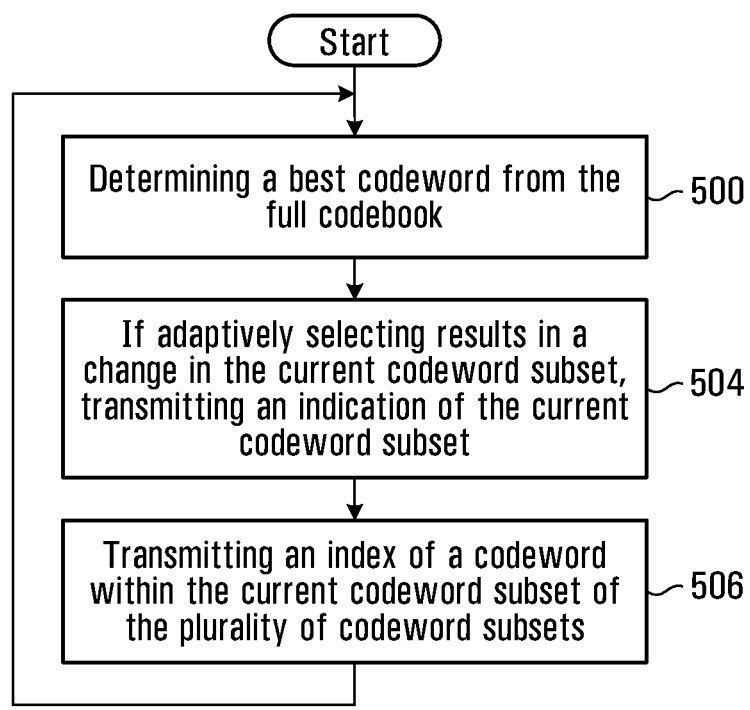
FIG. 16 is a table showing codewords and associated codeword subsets.

Referring now to FIG. 16, a method for execution, for example, by a MIMO receiver, will be described. The method is performed based on a plurality of codewords of a full codebook and a plurality of codeword subsets, each codeword subset containing a respective plurality of the codewords of the full codebook. The steps 500, 504, 506 are performed repeatedly for each of a plurality of periods, which may, for example each relate to a respective MIMO channel feedback instance.

A best codeword from the full codebook is determined at step 500. Next, at step 502, a codeword subset is adaptively selected of the plurality of codeword subsets to be a current codeword subset by selecting, based on a threshold criterion, between a) the most recently selected current codeword subset and b) another codeword subset that contains the best codeword from the full codebook. At step 504, if adaptively selecting results in a change in the current codeword subset, an indication of the current codeword subset is transmitted. At step 506, an index of a codeword within the current codeword subset of the plurality of codeword subsets is transmitted.

In some embodiments, the adaptively selecting involves determining if the best codeword from the full codebook also belongs to the most recently selected codeword subset, and if so, selecting the most recently selected current codeword subset to be the current codeword subset.

In some embodiments, adaptively selecting further involves, (optionally only if the best codeword from the full codebook does not also belong to the most recently selected codeword subset):

selecting a best codeword from the most recently selected codeword subset;

if the best codeword from the most recently selected codeword subset and the best codeword from the full codebook together satisfy the threshold criterion, selecting the current codeword subset to be the most recently selected current codeword subset and otherwise selecting the current codeword subset to be the codeword subset that contains the best codeword from the full codebook.

In some embodiments, the best codeword from the most recently selected current codeword subset and the best codeword from the full codebook together satisfy the threshold criterion when a correlation between the best codeword from the most recently selected current codeword subset and the best codeword from the full codebook is higher than a defined threshold.

In some embodiments, each codeword subset has a corresponding unique identifier, and transmitting an indication of the current codeword subset comprises transmitting the unique identifier associated with the current codeword subset. The embodiments described below that do not employ header codewords are examples of this.

In some embodiments, for each codeword subset, there is an associated header codeword belonging to the full codebook or a coarse subset of the full codeword. Transmitting an indication of the current codeword subset comprises transmitting an index of the associated header codeword of the current codeword subset within the full codebook or the coarse subset. The embodiments described below that employ header codewords are examples of this.

In some embodiments, a respective codeword subset $S_i$ is created for each codeword $c_i$ of the full codebook C, as illustrated in FIG. 17. The codewords in the codeword subset $S_i$ will differ from one codeword subset $S_i$ to another. In another embodiment, rather than creating a codeword subset $S_i$ for each and every codeword $c_i$ of the full codebook C, a respective codeword subset $S_i$ is created for each codeword $c_i$ of a coarse subset of the full codebook. In either case, a codeword for which there is an associated codeword subset is referred to herein as a header codeword. The coarse subset contains some but not all of the codewords of the full codebook C. In a specific example, the coarse subset might contain N of the M codewords of the full codebook. N might, for example be $\frac{1}{8} \times M$.

The codeword subset $S_i$ for codeword $c_i$ contains L codewords $c_j$, which are selected from all the codewords in the codebook C. In some embodiments, the codewords $c_j$ in a codeword subset $S_i$ are L codewords from the full codebook that are best correlated with the codeword $c_i$ as defined by a correlation criterion. The codewords in each codeword subset are indexed using respective subset indices. Every codeword has an index into the full codebook C (or coarse subset) that uniquely identifies the codeword among all other codebooks of the full codebook C (or coarse subset), and a subset index for a codeword subset to which the codeword belongs that uniquely identifies the codeword among other codewords of the codeword subset. Each index of a codeword of the full codebook C (or coarse subset) in effect points to the respective codeword subset.

In a first example, consider a full codebook with sixteen codewords, a coarse codebook containing four codewords from the full codebook, with each codeword of the course codebook pointing to a respective codeword subset containing four codewords of the full codebook. The full codebook contains 16 codewords CA0, CA1, CA2, CA3, CB1, CB2, CB3, CC0, CC1, CC2, CC3, CD0, CD1, CD2, CD3. The coarse subset includes four codewords from the full codebook, namely CA1, CB1, CC1 and CD1, and the associated codeword subsets might be defined as:
  codeword subset for CA1: CA0 to CA3
  codeword subset for CB1: CB0 to CB3
  codeword subset for CC1: CC0 to CC3
  codeword subset for CD1: CD0 to CD3.
When an index of a codeword in the coarse subset is to be transmitted, two bits can be used to select between CA1,CB1, CC1,CD1. When an index of a codeword in a codebook subset is to be transmitted, two bits can be used to select a codeword from the current codeword subset, namely the codeword subset associated with the coarse codeword for which an index was most recently transmitted. For example, if the most recent coarse codeword was CA1, then the two bits can be used to select between CA0,CA1,CA2,CA3.

A second example will now be described with reference to FIG. 18. A codeword subset $S_7$, which corresponds to the codeword $c_7$, is defined to include L=8 codewords $c_j$. The L codewords have respective subset codeword indices 0, ..., 7. The codewords $c_j$ in the codeword subset $S_7$ are the eight codewords that are best correlated with the codeword $c_7$ as defined by a correlation criterion. In this example, the codeword subset $S_7$ associated with codeword $c_7$ is defined to include codewords $c_3$, $c_{13}$, $c_{16}$, $c_{25}$, $c_{37}$, $c_{41}$, $c_{49}$, and $c_{60}$.

In some embodiments, such as is the case in the first example, each codeword of the full codebook (or course subset) for which an associated codeword subset is defined is included in the associated codeword subset. In the first example, CA1 has an associated codeword subset containing codewords CA0,CA1,CA2,CA3, and CA1 is included in the associated codeword subset.

In some embodiments, such as in the case of the second example, each codeword of the full codebook (or coarse subset) for which an associated codeword subset is defined is not necessarily included in the associated codeword subset. Specifically, $c_7$ has an associated codeword subset $c_3$, $c_{13}$, $c_{16}$, $c_{25}$, $c_{37}$, $c_{41}$, $c_{49}$, and $c_{60}$, and $c_7$ is not included in the associated codeword subset.

As indicated above, in some embodiments, the codeword subsets $S_i$ are created by identifying the L codewords $c_j$ that are best correlated with the codeword $c_i$ as defined by some correlation criterion. Those skilled in the art will recognize various techniques for determining codewords $c_i$, $c_j$, that have the highest correlations. For example, identifying the codewords $c_i$, $c_j$ having the highest correlations may be determined using the normalized interproduct criterion defined as:

$$\langle c_i, c_j \rangle = \frac{c_i^+ c_j}{\|c_i\| * \|c_j\|}$$

In some embodiments, where a respective codebook subset is defined for every codeword of the full codebook, the subset index, which is used to identify each of the codewords $c_j$ of the codeword subset $S_i$, will require $\log_2(L)$ bits, whereas the full codebook index requires $\log_2(M)$ bits. There is a savings in terms of the amount of bits required to feedback the codeword index that is a function of how much smaller L is than M.

In one embodiment, where a respective codebook subset is defined for every codeword of a coarse subset having N codewords out of the M codewords of the full codebook, the subset index, which is used to identify each of the codewords $c_j$ of the codeword subset $S_i$, will require $\log_2(L)$ bits, whereas the coarse subset index requires $\log_2(N)$ bits.

In the example described above, the number of codewords in a codeword subset (L) is eight times less than the number of codewords in the full codebook C (M). The codebook C, including the codeword subsets, is provided in the MIMO transmitter 202 as well as in the MIMO receiver 206. The codebook C will remain substantially fixed, and if there is a change to a codebook C in the MIMO transmitter 202, there must be corresponding changes in the MIMO receiver 206 to ensure that the codebooks C remain the same.

In some embodiments, the MIMO receiver 206 will initially identify the channel conditions of the MIMO channel and search the full codebook C for a first codeword based on the channel conditions of the MIMO channel that is the best codeword of the full codebook C. The MIMO receiver 206 will then transmit the codeword index of the first codeword in the full codebook back to the MIMO transmitter 202 as feedback. The MIMO transmitter 202 will use the codeword index to identify the first codeword to employ when weighting and/or pre-coding the MIMO signals to be transmitted to the MIMO receiver 206. For subsequent feedback instances, the MIMO receiver will either transmit an index corresponding to a selected codeword of the codeword subset corresponding to the codeword of the full codebook (or coarse codebook) for which an index was most recently transmitted, or an index corresponding to a newly selected codeword determined from a search of the entire codebook C (or coarse codebook). Initially, the codeword subset corresponding to the codeword of the full codebook (or coarse codebook) for which an index was most recently will be the codeword subset of the first codeword. However, from time to time, as determined by the adaptation performed by the MIMO receiver, an index of a newly selected codeword determined from a search of the entire codebook C (or coarse codebook) is transmitted. The codeword subset of the most recently selected codeword from the full codebook C (or coarse codebook) is used when transmitting an index of a subset codeword.

The following approach is taken to determine whether to send an index corresponding to a selected codeword of the codeword subset or to send an index of a codeword from the full codebook C (or coarse subset). Note that this is a particular example of step 502 of FIG. 16 in the sense that if an index of a codeword in the current codeword subset is transmitted, then the most recently selected current codeword subset is (again) selected as the current codeword subset. If instead an index of a codeword in the full codebook (or coarse subset), then the current codeword subset is selected to be the codeword subset of another codeword subset that contains the best codeword from the full codebook.

Update Channel Conditions

To begin, The MIMO receiver 206 will again identify channel conditions for the MIMO channel.

Identify Codeword from Full Codebook (or Coarse Subset)

The full codebook C is searched (or the coarse codebook), and from the M codewords of the codebook C (or the N codewords of the coarse subset), the MIMO receiver 206 will select the best codeword, hereinafter the "second codeword". The index of the second codeword in the full codebook (or coarse subset) is available for transmission back to the MIMO transmitter 202 as feedback. However, as described below, it may or may not actually be transmitted.

Identify Codeword from Codeword Subset

The MIMO receiver 206 conducts a search for the best codeword that belongs to the codeword subset associated with the codeword of the full codebook (or coarse subset) for which an index was most recently transmitted.

From the L codewords of the codeword subset, the MIMO receiver 206 will select the best codeword, hereinafter the "third codeword". The index of the third codeword in the codeword subset is available for transmission back to the MIMO transmitter 202 as feedback. However, as described below, this index may or may not actually be transmitted.

In the event the index of the codeword in the codeword subset is transmitted, the MIMO transmitter 202 will use the index to identify the second codeword from the codeword subset associated with the most recently transmitted index of a codeword in the full codebook (or coarse subset). Once the third codeword is obtained, the corresponding weighting factors/pre-coding are provided to the MIMO signals being transmitted to the MIMO receiver 206 from the MIMO transmitter 202.

Apply Threshold Criterion

Next, a threshold criterion is applied to the second codeword and the third codeword to select either the second codeword or the third codeword. This may, for example involve, applying a threshold criterion to the second codeword and the third codeword. For example, if they are sufficiently similar, as defined by an appropriate threshold criterion such as a correlation criterion, then the third codeword is selected and the index of the third codeword in the current codeword subset (namely the codeword subset associated with the codeword of the full/coarse codebook for which an index was most recently transmitted) is transmitted, and otherwise the second codeword is selected and the index of the second codeword in the full/coarse codebook is transmitted, as well as an indication that the index being transmitted is from the full codebook (or coarse subset), and that therefor the codeword from the full codebook (or coarse subset) for which an index was most recently transmitted should be updated to be the second codeword, and accordingly the current codeword subset should be switched to be the subset that corresponds with second codeword.

In a specific example, a correlation metric is used that is the same as that used to select the codeword subsets in the first place. In the specific example given above, the correlation metric was the normalized interproduct criterion defined as:

$$\langle c_i, c_j \rangle = \frac{c_i^* c_j}{\|c_i\| * \|c_j\|}$$

If the normalized interproduct of the second codeword and the third codeword exceeds a threshold, then the threshold criterion is satisfied, and the index of the third codeword in the codeword subset is transmitted, and otherwise the index of the second codeword in the full codebook (or coarse subset) is transmitted.

Alternatively, if they are sufficiently dis-similar, as defined by an appropriate criterion such as a correlation criterion, then the second codeword is selected and the index of the second codeword in the full/coarse codebook is transmitted, and otherwise the third codeword is selected and the index of the third codeword in the current codeword subset (namely the codeword subset associated with the codeword of the full/coarse codebook for which an index was most recently transmitted) is transmitted. If the index of the second codeword is transmitted, an indication that the index being transmitted is from the full codebook (or coarse codebook) is also sent, this also indicating that the codeword from the full/coarse codebook for which an index was most recently transmitted should be updated to be the second codeword, and accordingly the current codeword subset should be reset to be the subset that corresponds with second codeword.

In a specific example, a correlation metric is used that is the same as that used to select the codeword subsets in the first place. In the specific example given above, the correlation metric was the normalized interproduct criterion defined as:

$$\langle c_i, c_j \rangle = \frac{c_i^* c_j}{\|c_i\| * \|c_j\|}$$

If the normalized interproduct of the second codeword and the third codeword is below a threshold, then the threshold criterion is satisfied, and the index of the second codeword in the full codebook (or coarse subset) is transmitted, and otherwise the index of the third codeword in the current codeword subset is transmitted.

In another embodiment that results in the same index being transmitted, but which results in a slightly reduced searching some of the time, the second codeword (in the full or coarse codebook) is computed, and if that codeword belongs to the current codeword subset, then by definition, the same codeword would be selected if a search were to be conducted of the current codeword subset, and as such, it is not necessary to search the current codeword subset. Rather, the index of the second codeword within the current codeword subset is looked up and transmitted as feedback. Typically, the index of the second codeword in the current codeword subset will be different from the index of the second codeword in the full or coarse codebook. If the second codeword does not belong to the current codeword subset $S_i$, then the method continues as in the previously described embodiment with the determination of a codeword in the codeword subset, and application of the threshold criterion to select between the second codeword and the third codeword.

Figure 19:
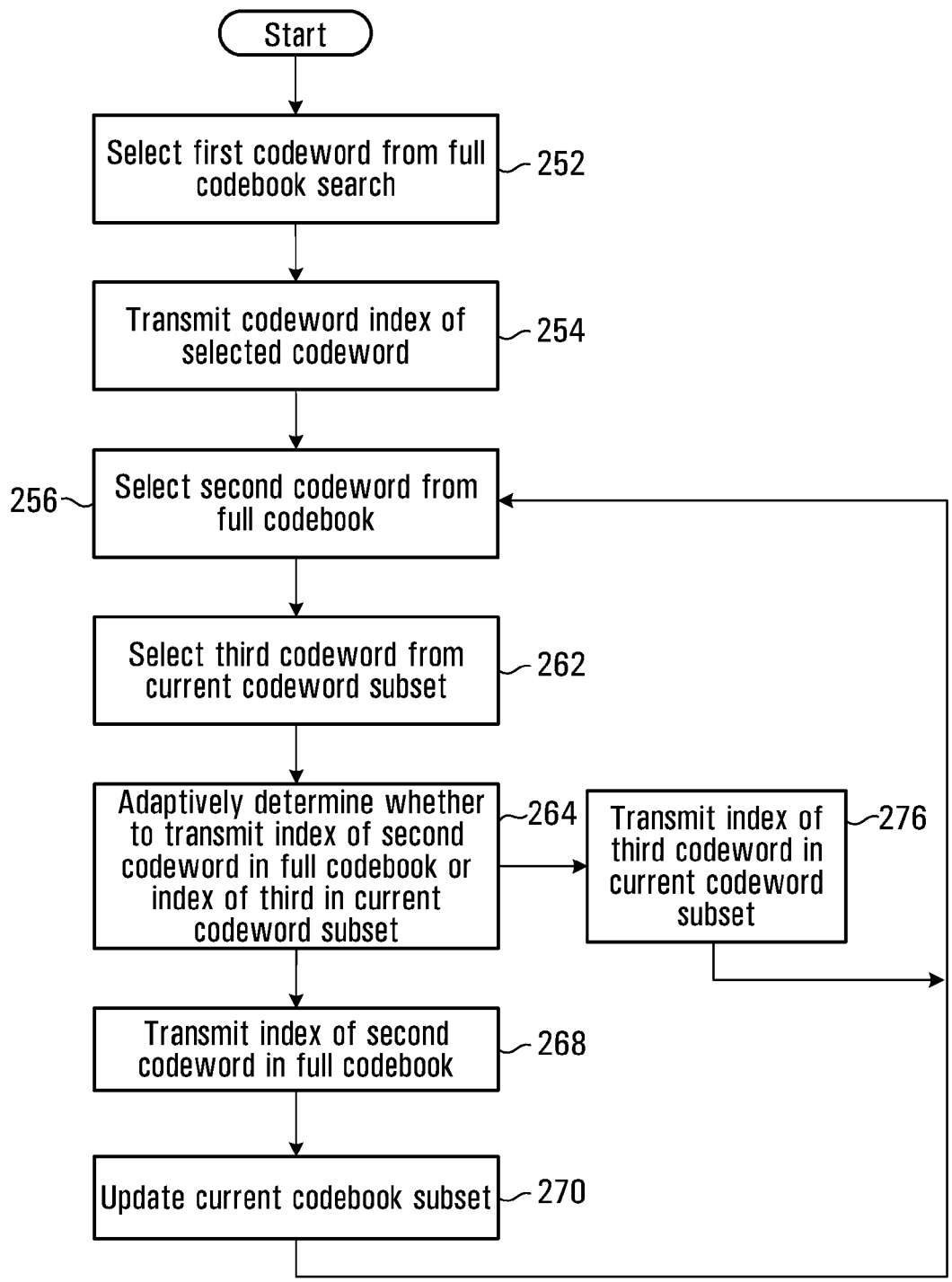
FIGS. 19 and 20 are flowcharts of two methods of transmitting codeword indices.

With reference to FIG. 19, a flow diagram illustrating a method provided by an embodiment of the invention. This may, for example, be implemented in a MIMO receiver, for example MIMO receiver 206, to feedback information to a MIMO receiver. More generally, these methods may be employed whenever the identity of a codeword is to be communicated through the use of indexes. The flowchart and description assumes that each codeword of the full codebook has an associated codeword subset. However, this method can also be applied with a coarse codeword codebook. Operation begins where the selection of a first codeword from a full codebook search (step 252). This may, for example, be based on channel estimates, but more generally, it can be selected based on any appropriate selection criteria. The codeword index of the first codeword is then transmitted (step 254). The method continues with the selection of a second codeword from a full codebook search (step 256). Next, a search of the current codeword subset is made for a third codeword (step 262). The same selection criteria are applied in searching for the third codeword as was applied when searching for the second codeword. Next, adaptively determine whether to transmit an index of the second codeword in the full codebook, or to transmit an index of the third codeword in the current codeword subset (step 264). Following this, depending on the determination, either an index of the third codeword in the current codeword subset is transmitted (step 266) or an index of the second codeword in the full codebook is transmitted (step 268). In a specific example, step 264 involves comparing the second codeword and the third codeword, and if they are sufficiently similar then the index of the third codeword in the current codeword subset is transmitted (step 266) and otherwise the index of the second codeword in the full codebook is transmitted (step 268). Further, the current codeword subset will not change until a new full codebook index is fed transmitted. When a full codebook index is transmitted (and becomes the most recently transmitted index of a codeword in the full codebook), the current codebook subset is updated accordingly (step 270). Following any one of method steps 466,270, the method continues at step 256.

Figure 20:
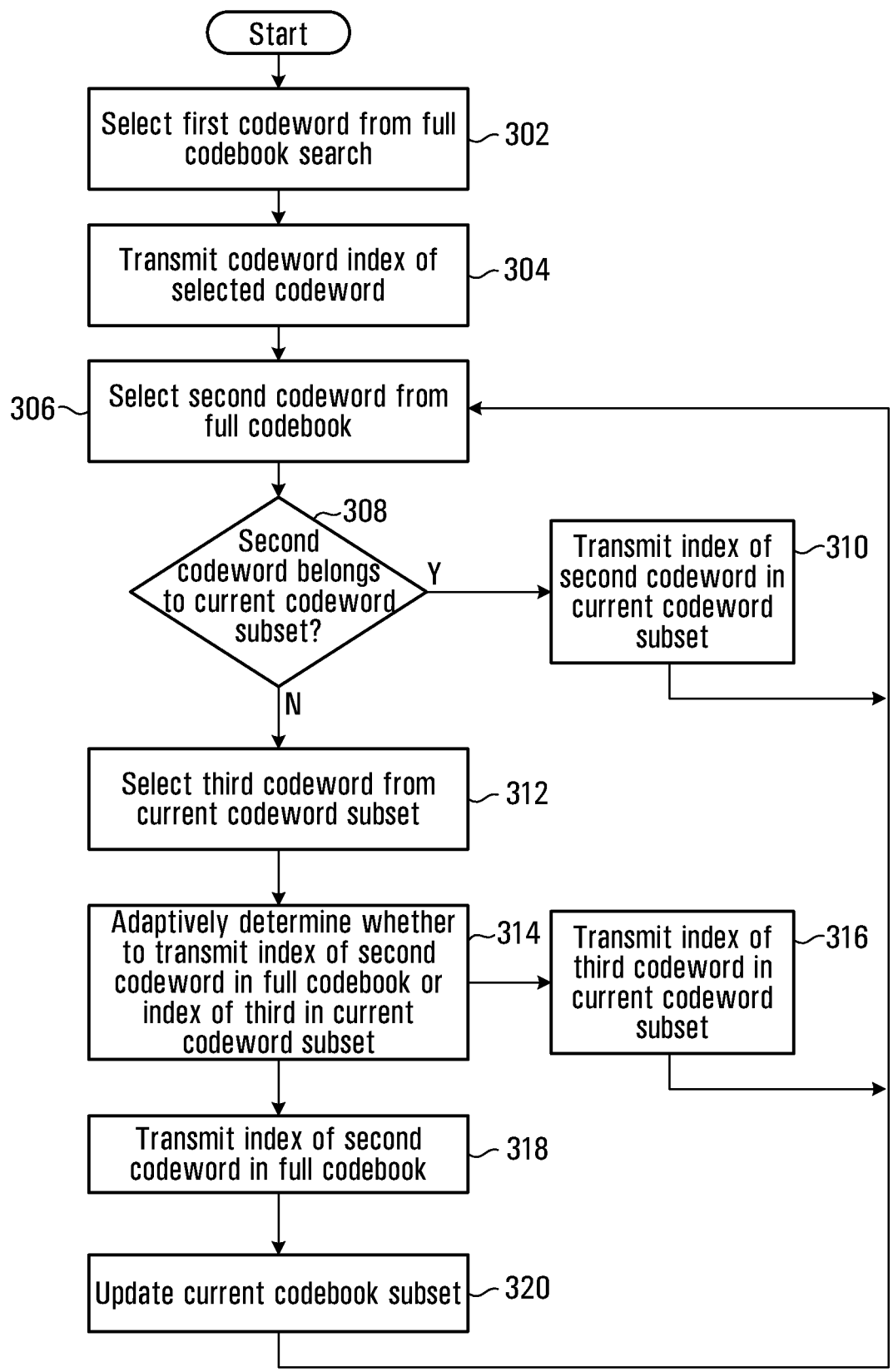

With reference to FIG. 20, a flow diagram illustrating a method provided by an embodiment of the invention. This may, for example, be implemented in a MIMO receiver, for example MIMO receiver 206, to feedback information to a MIMO receiver. More generally, these methods may be employed whenever the identity of a codeword is to be communicated through the use of indexes. The flowchart and description assumes that each codeword of the full codebook has an associated codeword subset. However, this method can also be applied with a coarse codeword codebook. Operation begins where the selection of a first codeword from a full codebook search (step 302). This may, for example, be based on channel estimates, but more generally, it can be selected based on any appropriate selection criteria. The codeword index of the first codeword is then transmitted (step 304). The method continues with the selection of a second codeword from a full codebook search (step 306). Again, this may, for example, be based on channel estimates, but more generally, it can be selected based on any appropriate selection criteria. If the second codeword belongs to the current codeword subset (namely the codeword subset associated with the codeword of the full codebook for which an index was most recently transmitted) (yes path step 308), then the index of the second codeword in the current codeword subset is determined and transmitted (step 310). If the second codeword does not belong to the current codeword subset (no path step 308), a search of the current codeword subset is made for a third codeword (step 312). The same selection criteria are applied in searching for the third codeword as was applied when searching for the second codeword. Next, adaptively determine whether to transmit an index of the second codeword in the full codebook, or to transmit an index of the third codeword in the current codeword subset (step 314). Following this, depending on the determination, either an index of the third codeword in the current codeword subset is transmitted (step 316) or an index of the second codeword in the full codebook is transmitted (step 318). In a specific example, step 314 involves comparing the second codeword and the third codeword (step 314), and if they are sufficiently similar then the index of the third codeword in the current codeword subset is transmitted (step 316) and otherwise the index of the second codeword in the full codebook is transmitted (step 318). Further, the current codeword subset will not change until a new full codebook index is fed transmitted. When a full codebook index is transmitted (and becomes the most recently transmitted index of a codeword in the full codebook), the current codebook subset is updated accordingly (step 320). Following any one of method steps 310, 316, 320, the method continues at step 308.

Figure 21:
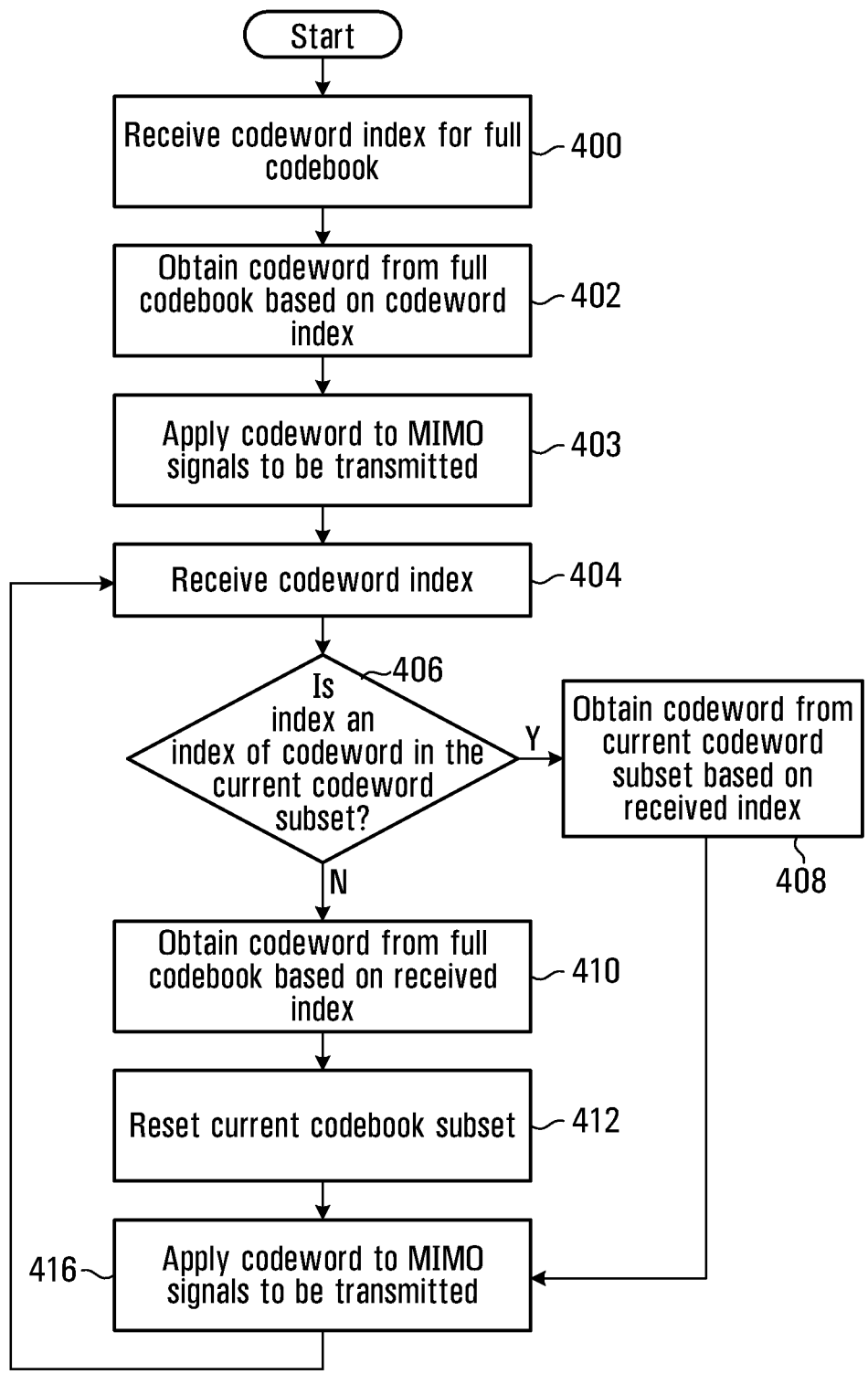
FIG. 21 is a flowchart of a method of receiving codeword indices.

With reference to FIG. 21, a flow diagram of another method provided by an embodiment of the invention will now be described. The flowchart and description assumes that each codeword of the full codebook has an associated codeword subset. However, this method can also be applied with a coarse subset. In a specific example, this method may be implemented in a MIMO transmitter, such as MIMO transmitter 202. More generally, these methods may be employed whenever the identity of a codeword is to be communicated through the use of indexes. Operation begins with the reception of a codeword index for a codeword in a full codebook C (step 400). A codeword from the full codebook C based on the codeword index (step 402) is obtained. In embodiments where the codewords are representative of weighting or pre-coding to be applied to MIMO signals to be transmitted by a MIMO transmitter, the MIMO transmitter will then apply the codeword to the MIMO signals to be transmitted to the MIMO receiver (step 403). Next, a further codeword index is received. (step 404). If the index is an index of a codeword in the current codeword subset (namely the codeword subset associated with the codeword of the full codeset for which an index was most recently transmitted) (yes path step 406), then the current codeword subset is consulted, and using the index, the appropriate codeword is obtained (step 408). If the index is not an index of a codeword in the current codeword subset subset index (no path, step 406), then it is an index into the full codebook, and the index is used to obtain the appropriate codeword from the full codebook (step 410). In addition, the current codebook subset is reset to be that associated with the codeword thus obtained (step 412). After step 412 or 418, in embodiments where the codewords are representative of weighting or pre-coding to be applied to MIMO signals to be transmitted by a MIMO transmitter, the MIMO transmitter will then apply the codeword to the MIMO signals to be transmitted to the MIMO receiver 206 (step 416). The method continues back at step 404 with the receipt of another codeword index.

Those skilled in the art will recognize that codewords may have various configurations, but in any case will effectively define weighting factors in the form of matrices, vectors, and the like to apply to MIMO signals to be transmitted from the various antennas 204 of the MIMO transmitter 202.

Further, for OFDM systems, the codeword subsets may be arranged by time and frequency. As such, the subset indices may relate to and be selected from codebook codewords having the best correlations in the time or frequency direction in the OFDM spectrum.

Subset Switching Mechanism—Full Codebook

In some of the above described embodiments, some of the time the MIMO receiver transmits a codeword (or index) from the full codebook, while other times, the MIMO transmits an index of a codeword from the codeword subset associated with the codeword of the full codebook for which an index was most recently transmitted. After the index of a codeword from the full codebook is transmitted, the current codeword subset is switched to be the codeword subset associated with the codeword of the full codebook.

In some embodiments, a first index length, in bits, is used for indexing a codeword in a codeword subset, and a second index length, in bits, is used for indexing a codeword in the full codebook. Since there are fewer codewords in the codeword subset, the first length can be made less than the second length. For example, a p-bit index may be transmitted for a codeword in the codeword subset, and an m-bit index may be transmitted for a codeword in the full codebook.

The receiver (more generally the device that is encoding the codewords) will transmit information from which a determination can be made of whether a given index is an index of a codeword in the full codebook as opposed to an index of a codeword in the current codeword subset. In some embodiments, this is sent each time an index of a codeword in the full codebook is transmitted, but other implementations are possible, although they may be less efficient. For example, a single bit could be transmitted with every index that indicates what type of index it is, namely an index into the full codebook or an index into a codebook subset.

If a p-bit index is used for the codeword subset, then the there are $2^p$ unique p-bit indexes. In some embodiments, a codeword subset is defined to contain up to $2^p$-1 codewords (using up $2^p$-1 indices), and the remaining p-bit index is used to indicate that the next index is an index of a codeword from the full codebook. This may, for example, be an all zeros index, or any other predefined index. An index of a codeword from the full codebook is then transmitted, and the current codebook subset is updated to be the codebook subset associated with that codeword.

In a specific example, to indicate a switch in the codeword subset, the receiver transmits feedback that contains the remaining p-bit index, plus an m-bit index representing normal encoding of a codeword belongs to the entire codebook, where it is assumed that the whole codebook contains up to $2^m$ codewords.

This mechanism can be applied to dynamic or adaptive reset. With dynamic reset, the codeword subset is switched each time the best codeword from the overall codeword does not belong to the current codeword subset.

Subset Switching Mechanism—Coarse Codebook

In some of the above described embodiments, some of the time the MIMO receiver transmits a codeword from a coarse subset of the full codebook, while other times, the MIMO transmits an index of a codeword from the codeword subset associated with the codeword of the coarse subset of the full codebook for which an index was most recently transmitted. After the index of a codeword from the coarse codebook is transmitted, the current codeword subset is switched to be the codeword subset associated with the codeword of the coarse codebook.

In some embodiments, a first index length, in bits, is used for indexing a codeword in a codeword subset, and a second index length, in bits, is used for indexing a codeword in the full codebook. There may or may not be fewer codewords in the codeword subset than in the coarse subset. For example, a p-bit index may be transmitted for a codeword in the codeword subset, and an k-bit index may be transmitted for a codeword in the coarse subset.

The receiver (more generally the device that is encoding the codewords) will transmit information from which a determination can be made of whether a given index is an index of a codeword in the coarse codebook as opposed to an index of a codeword in the current codeword subset. In some embodiments, this is sent each time an index of a codeword in the full codebook is transmitted, but other implementations are possible, although they may be less efficient. For example, a single bit could be transmitted with every index that indicates what type of index it is, namely an index into the coarse codebook or an index into a codebook subset.

If a p-bit index is used for the codeword subset, then the there are $2^p$ unique p-bit indexes. In some embodiments, a codeword subset is defined to contain up to $2^p$-1 codewords (using up $2^p$-1 indices), and the remaining p-bit index is used to indicate that the next index is an index of a codeword from the coarse codebook. This may, for example, be an all zeros index, or any other predefined index. An index of a codeword from the full codebook is then transmitted, and the current codebook subset is updated to be the codebook subset associated with that codeword.

In a specific example, to indicate a switch in the codeword subset, the receiver transmits feedback that contains the remaining p-bit index, plus a k-bit index representing normal encoding of a codeword belongs to the coarse codebook, where it is assumed that the coarse codebook contains up to $2^k$ codewords.

This mechanism can be applied to dynamic or adaptive reset. With dynamic reset, the codeword subset is switched each time the best codeword from the overall codeword does not belong to the current codeword subset.

In the above described embodiments, every index fed back from the receiver is associated with a codeword from full codebook. Either the index is an index into the full codebook/ coarse codebook, or the index is into the current codeword subset. Whenever the transmitted index is an index of a codeword in the full codebook/coarse codebook, the current codeword subset is switched to be the codeword subset associated with the codeword in the full codebook/coarse codebook. For the coarse subset embodiments, each codeword of the coarse subset can be viewed as a header codeword for the associated codeword subset. For the case where a codeword subset is defined for every codeword of the full codebook, each codeword of the full codebook can be viewed as a header codeword for the associated codeword subset. Both types of embodiments can be collectively referred to as embodiments that employ header codewords.

In another class of embodiments, header codewords are not employed. Rather, a set of codeword subsets are defined such that the codewords of a given subset are relatively close to each other, for example using the correlation criterion defined previously. The receiver picks the best codeword from the full codebook, and determines which codebook subset this belongs to. The receiver then feeds back to the transmitter an indication of which codebook subset is being used. The indication on its own is not an indication of any specific codeword in the codebook subset, but rather simply indicates the codebook subset as a whole. This becomes the "current codebook subset". The receiver then feeds back to the transmitter an index of the best codeword in the current codebook subset. Then, the next time feedback is to be performed, the best codeword from the full codebook is selected and the best codeword from the current codeword subset is selected. If the best codeword from the current codeword subset is close enough to the best codeword from the full codebook, as determined by a threshold criterion, then an index of the best codeword of the current codeword subset is transmitted. Otherwise, the receiver feeds back an indication of a different codebook subset which is to become the new current codebook subset, namely the codebook subset to which the best codeword selected from the full codebook belongs, followed by an index of the best codeword into the new current codebook subset.

In some such embodiments, when transmitting indexes into codebook subsets, a specific index is reserved to indicate that the next feedback concerns a switch in the current codebook subset. Alternatively, this can be conveyed in some other manner.

For example, assuming a codebook having $2^{(N1+N2)}$ codewords, this can be divided into $2^{N1}$ codeword subsets via a correlation criteria, each having $2^{N2}$ members. N1 bits can be used to signal a particular current codeword subset, and N2 bits can be used to index a particular codeword within the current codeword subset. With this approach, the N1+N2 bits together identify a specific codeword from the full codeword. The N1 bits can be viewed as a coarse index, and the N2 bits viewed as a differential index.

The threshold criterion for switching between codeword subsets for these embodiments can be the same as described previously for embodiments that make use of header codewords. For example, a switch may be made when the best codeword from the full codebook differs from the best codeword from the current codeword subset by more than a threshold amount, or conversely a switch may not be made when the best codeword from the full codebook is similar enough to the best codeword from the current codeword subset as defined for example by a correlation criterion exceeding a threshold.

It will be appreciated that that any module, component, or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Any application or module herein described may be implemented using computer readable/executable instructions that may be stored or otherwise held by such computer readable media.

Figure 22:
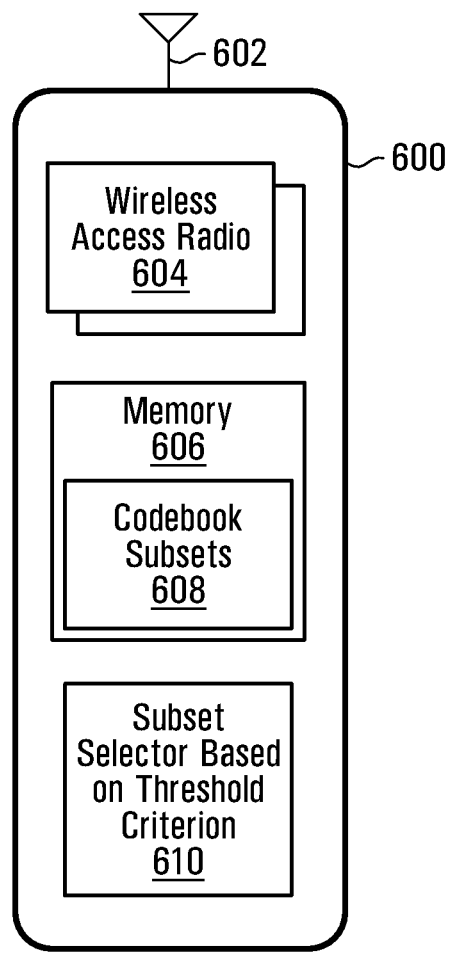
FIG. 22 is a block diagram of a receiver.

FIG. 22 is a block diagram of a receiver generally indicated at 600. The receiver 600 has at least one antenna 602 and at least one wireless access radio 604. The receiver has a memory 606 containing codebook subsets 608 as per any of the embodiments described herein. The receiver has a subset selector 610 that performs subset selection based on a threshold criterion, for example using one of the methods described herein.

Numerous modifications and variations of the present disclosure are possible in light of the above teachings. It is therefore to be understood that within the scope of the appended claims, the disclosure may be practiced otherwise than as specifically described herein.

The invention claimed is:

1. A method comprising:
in respect of a plurality of codewords of a full codebook and a plurality of codeword subsets, each codeword subset containing a respective plurality of the codewords of the full codebook, repeatedly:
determining a best codeword from the full codebook;
adaptively selecting a codeword subset of the plurality of codeword subsets to be a current codeword subset by selecting, based on a threshold criterion, between a) the most recently selected current codeword subset and b) another codeword subset that contains the best codeword from the full codebook;
if adaptively selecting results in a change in the current codeword subset, transmitting an indication of the current codeword subset;
transmitting an index of a codeword within the current codeword subset of the plurality of codeword subsets.

2. The method of claim 1 wherein adaptively selecting comprises:
determining if the best codeword from the full codebook also belongs to the most recently selected codeword subset, and if so, selecting the most recently selected current codeword subset to be the current codeword subset.

3. The method of claim 2 wherein adaptively selecting further comprises:
if the best codeword from the full codebook does not also belong to the most recently selected codeword subset:
selecting a best codeword from the most recently selected codeword subset;
if the best codeword from the most recently selected codeword subset and the best codeword from the full codebook together satisfy the threshold criterion, selecting the current codeword subset to be the most recently selected current codeword subset and otherwise selecting the current codeword subset to be the codeword subset that contains the best codeword from the full codebook.

4. The method of claim 1 wherein adaptively selecting further comprises:
selecting a best codeword from the most recently selected codeword subset;
if the best codeword from the most recently selected current codeword subset and the best codeword from the full codebook together satisfy the threshold criterion, selecting the current codeword subset to be the most recently selected current codeword subset and otherwise selecting the current codeword subset to be the codeword subset that contains the best codeword from the full codebook.

5. The method of claim 4 wherein:
the best codeword from the most recently selected current codeword subset and the best codeword from the full codebook together satisfy the threshold criterion when a correlation between the best codeword from the most recently selected current codeword subset and the best codeword from the full codebook is higher than a defined threshold.

6. The method of claim 5 wherein the correlation is computed using a normalized interproduct criterion.

7. The method of claim 1 wherein:
each codeword subset has a corresponding unique identifier;
transmitting an indication of the current codeword subset comprises transmitting the unique identifier associated with the current codeword subset.

8. The method of claim 1 wherein:
for each codeword subset, there is an associated header codeword belonging to the full codebook;
transmitting an indication of the current codeword subset comprises transmitting an index of the associated header codeword of the current codeword subset within the full codebook.

9. The method of claim 8 further comprising:
transmitting information from which can be determined whether a transmitted index is an index of a codeword in the full codebook or an index of a codeword in the current codeword subset.

10. The method of claim 9 wherein:
for each codeword of the current codeword subset, the index of the codeword is a respective N-bit index;
an N-bit index that is not used for any of the codewords of the current codeword subset is used to indicate whether a transmitted index is an index into the full codebook or an index into the current codeword subset.

11. The method of claim 1 wherein:
for each codeword subset, there is an associated header codeword belonging to a coarse subset of full codebook;
transmitting an indication of the current codeword subset comprises transmitting an index of the associated header codeword of the current codeword subset within the coarse subset of the full codebook.

12. The method of claim 11 further comprising:
transmitting information from which can be determined whether a transmitted index is an index of a codeword in the coarse subset of the full codebook or an index of a codeword in the current codeword subset.

13. The method of claim 12 wherein:
for each codeword of the current codeword subset, the index of the codeword is a respective N-bit index;
an N-bit index that is not used for any of the codewords of the current codeword subset is used to indicate whether a transmitted index is an index of a codeword in the full codebook or an index of a codeword in the current codeword subset.

14. The method of claim 1 further comprising:
receiving space-time coded signals from a MIMO transmitter;
determining channel information for a MIMO channel;
each time a best codeword is selected from the full codebook or a codebook subset, selecting the best codeword from the full codebook or a codebook subset based on the channel information for the MIMO channel.

15. The method of claim 14 wherein the codebook codewords define weighting factors to apply to signals to be transmitted from the MIMO transmitter.

16. An apparatus comprising:
receive circuitry associated with a plurality of antennas;
transmit circuitry associated with the plurality antennas; and
a memory containing codeword subsets;
a subset selector based on threshold criterion that causes the apparatus to perform a method comprising:
in respect of a plurality of codewords of a full codebook and a plurality of codeword subsets, each codeword subset containing a respective plurality of the codewords of the full codebook, repeatedly:
determining a best codeword from the full codebook;
adaptively selecting a codeword subset of the plurality of codeword subsets to be a current codeword subset by selecting, based on a threshold criterion, between a) the most recently selected current codeword subset and b) another codeword subset that contains the best codeword from the full codebook;
if adaptively selecting results in a change in the current codeword subset, transmitting an indication of the current codeword subset;
transmitting an index of a codeword within the current codeword subset of the plurality of codeword subsets.

17. The apparatus of claim 16 wherein the apparatus is a mobile station.

18. The apparatus of claim 16 wherein:
each codeword subset has a corresponding unique identifier;
the apparatus transmits an indication of the current codeword subset by transmitting the unique identifier associated with the current codeword subset.

19. The apparatus of claim 16 wherein:
for each codeword subset, there is an associated header codeword belonging to the full codebook;
the apparatus transmits an indication of the current codeword subset by transmitting an index of the associated header codeword of the current codeword subset within the full codebook.

20. One or more non-transitory, computer readable storage media having instructions stored thereon that, when executed by a receiver, cause the receiver to implement:
in respect of a plurality of codewords of a full codebook and a plurality of codeword subsets, each codeword subset containing a respective plurality of the codewords of the full codebook, repeatedly:
determining a best codeword from the full codebook;
adaptively selecting a codeword subset of the plurality of codeword subsets to be a current codeword subset by selecting, based on a threshold criterion, between a) the most recently selected current codeword subset and b) another codeword subset that contains the best codeword from the full codebook;
if adaptively selecting results in a change in the current codeword subset, transmitting an indication of the current codeword subset;
transmitting an index of a codeword within the current codeword subset of the plurality of codeword subsets.

* * * * *